US012581645B2

(12) United States Patent
Bae et al.

(10) Patent No.: US 12,581,645 B2
(45) Date of Patent: Mar. 17, 2026

(54) SEMICONDUCTOR MEMORY DEVICES

(71) Applicant: Samsung Electronics Co., Ltd.,
Suwon-si (KR)

(72) Inventors: So Hyeon Bae, Suwon-si (KR); **Won
Chul Lee, Suwon-si (KR); Byeong Jun
Bae**, Suwon-si (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 748 days.

(21) Appl. No.: 18/077,419

(22) Filed: Dec. 8, 2022

(65) Prior Publication Data

US 2023/0363149 A1     Nov. 9, 2023

(30) Foreign Application Priority Data

May 9, 2022     (KR) ......................... 10-2022-0056454

(51) Int. Cl.
H10B 12/00          (2023.01)
H01L 21/02          (2006.01)
(52) U.S. Cl.
CPC ....... H10B 12/50 (2023.02); H01L 21/02362
(2013.01); H10B 12/315 (2023.02); **H10B
12/488** (2023.02)
(58) Field of Classification Search
CPC ......... H01L 21/02362; H01L 21/28247; H01L
21/76834; H01L 23/5226
See application file for complete search history.

(56) References Cited

U.S. PATENT DOCUMENTS

| | | |
|---|---|---|
| 6,562,714 B1 | 5/2003 | Lee |
| 7,776,687 B2 | 8/2010 | Kang et al. |
| 7,863,123 B2 | 1/2011 | Bu et al. |
| 9,147,767 B2 | 9/2015 | Chen et al. |
| 9,368,603 B2 | 6/2016 | Chuang et al. |
| 9,508,590 B2 | 11/2016 | Chiang et al. |
| 10,361,119 B1 | 7/2019 | Motoyama et al. |
| 11,069,565 B2 | 7/2021 | Liu |
| 2021/0376103 A1 | 12/2021 | Liang et al. |
| 2022/0139927 A1 | 5/2022 | Chang et al. |

FOREIGN PATENT DOCUMENTS

KR          20090074470 A          7/2009

OTHER PUBLICATIONS

Communication pursuant to Article 94(3) EPC issued in EP Application No. 23164411.3 by European Patent Office, Jan. 5, 2024.

*Primary Examiner* — Amar Movva

(74) *Attorney, Agent, or Firm* — Wolf, Greenfield &
Sacks, P.C.

(57)          ABSTRACT

A semiconductor memory device may include a substrate including a cell region and a peripheral region defined around the cell region, and a gate structure which may include sequentially stacked first, second, and third conductive layers including different materials, the first conductive layer including polysilicon. A capping layer may be on the third conductive layer, and a spacer may be on a sidewall of each of the first to third conductive layers and the capping layer. A first contact may extend through the capping layer and into the third conductive layer, with the first contact in contact with the second conductive layer, and separated from the first conductive layer. The first contact may include a first portion in the third conductive layer and a second portion in the capping layer. A width of the first portion may be greater than a width of the second portion in a horizontal direction.

20 Claims, 36 Drawing Sheets

FIG. 18

SEMICONDUCTOR MEMORY DEVICES

CROSS-REFERENCE TO RELATED APPLICATION

This application claims priority and all the benefits accruing therefrom to Korean Patent Application No. 10-2022-0056454, filed on May 9, 2022, in the Korean Intellectual Property Office, and the entire contents of the above-identified application are herein incorporated by reference.

BACKGROUND

1. Technical Field

The present disclosure relates to semiconductor memory devices.

2. Description of the Related Art

As semiconductor elements are becoming increasingly highly integrated, discrete circuit patterns are becoming more miniaturized to implement more semiconductor elements on the same area. That is, as the degree of integration of the semiconductor element increases, a design rule for the components of the semiconductor element is decreasing.

In a highly scaled semiconductor element, a process of forming a plurality of wiring lines and a plurality of contacts interposed therebetween may become increasingly complex and difficult.

SUMMARY

Aspects of the present disclosure provide a semiconductor memory device having improved reliability by increasing a contact area between a gate structure and a contact.

According to some embodiments of the present disclosure, there is provided a semiconductor memory device, which may include a substrate including a cell region and a peripheral region defined around the cell region. A gate structure may be on the substrate, the gate structure including a first conductive layer including polysilicon, a second conductive layer on the first conductive layer, a third conductive layer on the second conductive layer, and a capping layer on the third conductive layer. The first to third conductive layers may include different materials. A spacer may be on a sidewall of each of the first to third conductive layers and the capping layer, and a first contact may extend through the capping layer and into the third conductive layer. The first contact may be in contact with the second conductive layer and separated from the first conductive layer, and the first contact may include a first portion in the third conductive layer and a second portion in the capping layer. A width of the first portion of the first contact in a first horizontal direction may be greater than a width of the second portion of the first contact in the first horizontal direction.

According to some embodiments of the present disclosure, there is provided a semiconductor memory device, which may include a substrate including a cell region and a peripheral region defined around the cell region. A gate structure may be on the cell region of the substrate and may extend in a first horizontal direction. The gate structure may include first, second, and third conductive layers that are sequentially stacked and a capping layer on the third conductive layer, and the first conductive layer may include polysilicon. A bit line contact may be in contact with the second conductive layer of the gate structure, and may extend through the first conductive layer and into the substrate. A first contact may extend through the capping layer and into the third conductive layer, with the first contact in contact with the second conductive layer and separated from the first conductive layer. The first contact may include a first portion in the third conductive layer and a second portion in the capping layer. A width of the first portion of the first contact in the first horizontal direction may be greater than a width of the second portion of the first contact in the first horizontal direction.

According to some embodiments of the present disclosure, there is provided a semiconductor memory device, which may include a substrate including a cell region and a peripheral region defined around the cell region. A gate structure may be on the peripheral region of the substrate, the gate structure including a gate insulating layer, a first conductive layer including polysilicon, a second conductive layer on the first conductive layer, a third conductive layer on the second conductive layer, a capping layer on the third conductive layer, and a spacer in contact with a sidewall of each of the gate insulating layer, the first to third conductive layers and the capping layer. A contact may extend through the capping layer and into the third conductive layer. The contact may be in contact with the second conductive layer, separated from the first conductive layer, and may include a first portion in the third conductive layer and a second portion in the capping layer. A width of the first portion of the contact in a horizontal direction may be greater than a width of the second portion of the contact in the horizontal direction.

According to some embodiments of the present disclosure, there is provided a semiconductor memory device, which may include a substrate including a cell region and a peripheral region defined around the cell region. A cell gate electrode may be inside the cell region of the substrate, the cell gate electrode may include titanium nitride (TiN). A cell gate capping conductive layer may be on the cell gate electrode and may include polysilicon. A cell gate capping layer may cover a sidewall and an upper surface of the cell gate capping conductive layer on the cell gate electrode, and may be in contact with an upper surface of the cell gate electrode. A contact may extend through the cell gate capping layer and into the cell gate electrode. The contact may be spaced apart from the cell gate capping conductive layer in a horizontal direction, and the contact may include a first portion in the cell gate electrode and a second portion in the cell gate capping layer. A width of the first portion of the contact in the horizontal direction may be greater than a width of the second portion of the contact in the horizontal direction.

However, aspects of the present disclosure are not restricted to those set forth herein.

The above and other aspects of the present disclosure will become more apparent to those of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which:

FIGS. 12 to 25 are intermediate step views for describing a method of manufacturing a semiconductor memory device according to some exemplary embodiments of the present disclosure;

DETAILED DESCRIPTION

Hereinafter, a semiconductor memory device according to some exemplary embodiments of the present disclosure will be described with reference to FIGS. 1 to 11.

Figure 1:
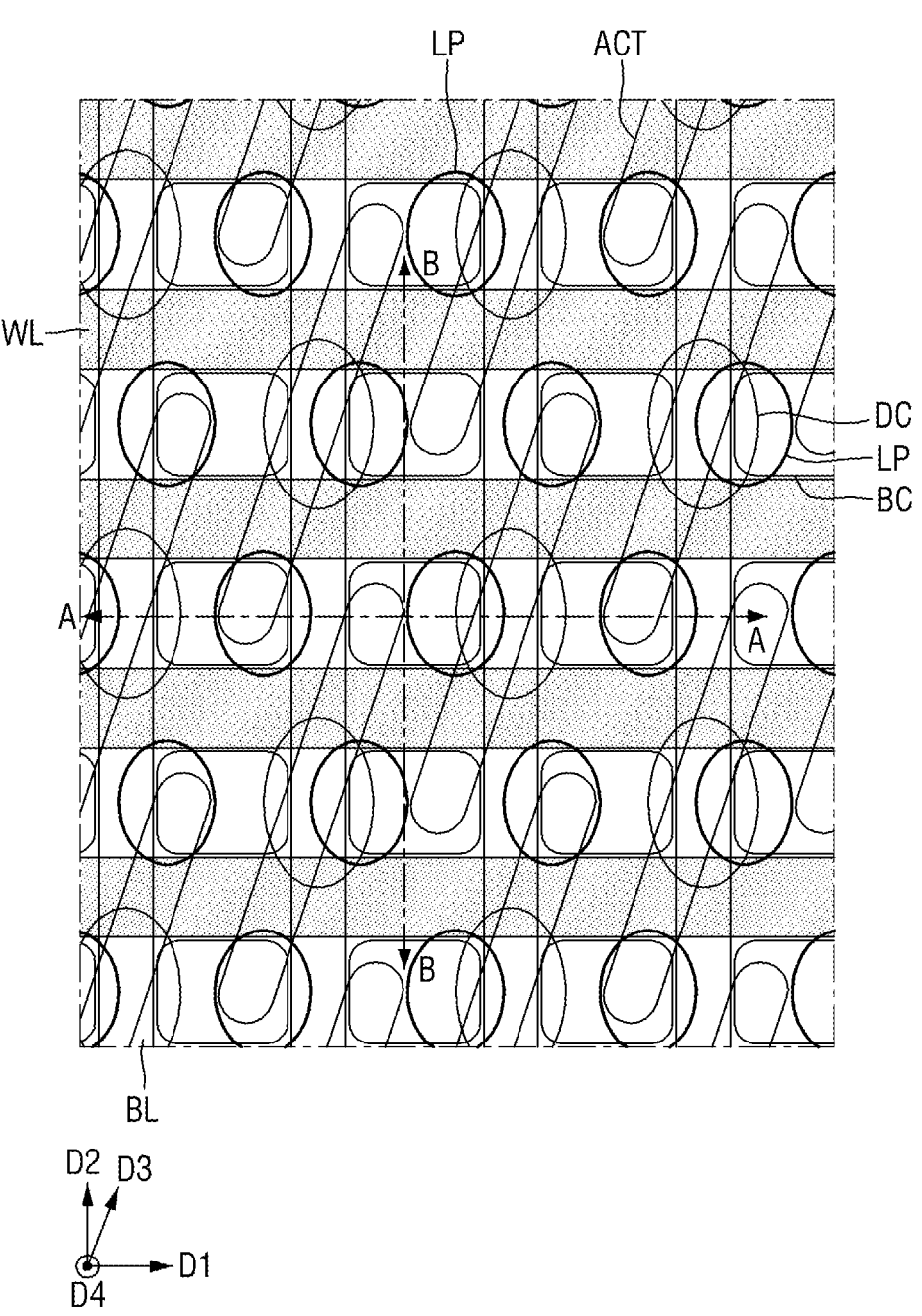
FIG. 1 is a schematic layout view for describing a cell region of a semiconductor memory device according to some exemplary embodiments of the present disclosure.
Figure 2:
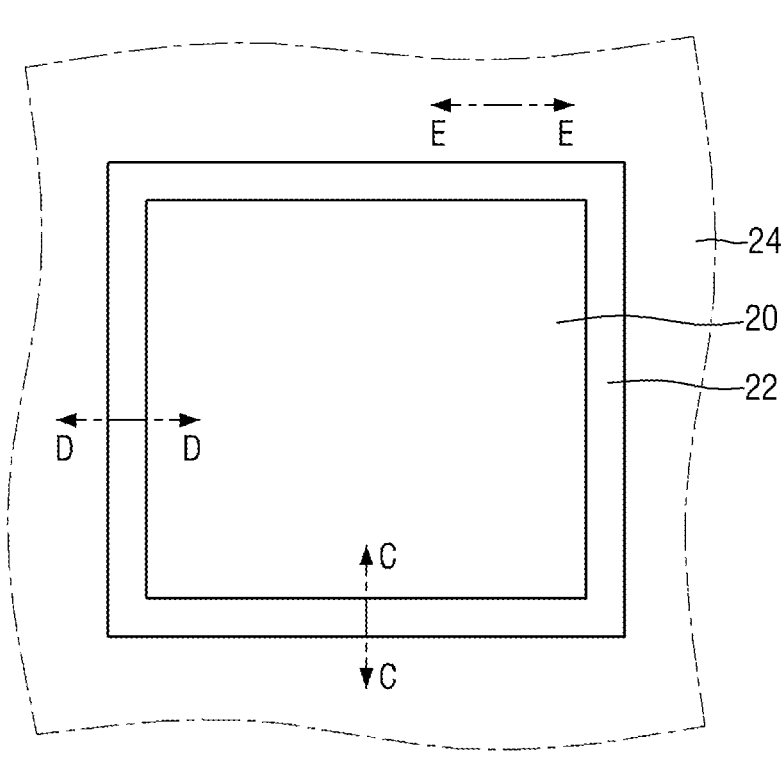
FIG. 2 is a schematic layout view of a semiconductor memory device including the cell region of FIG. 1.
Figure 2:
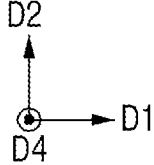
Figure 3:
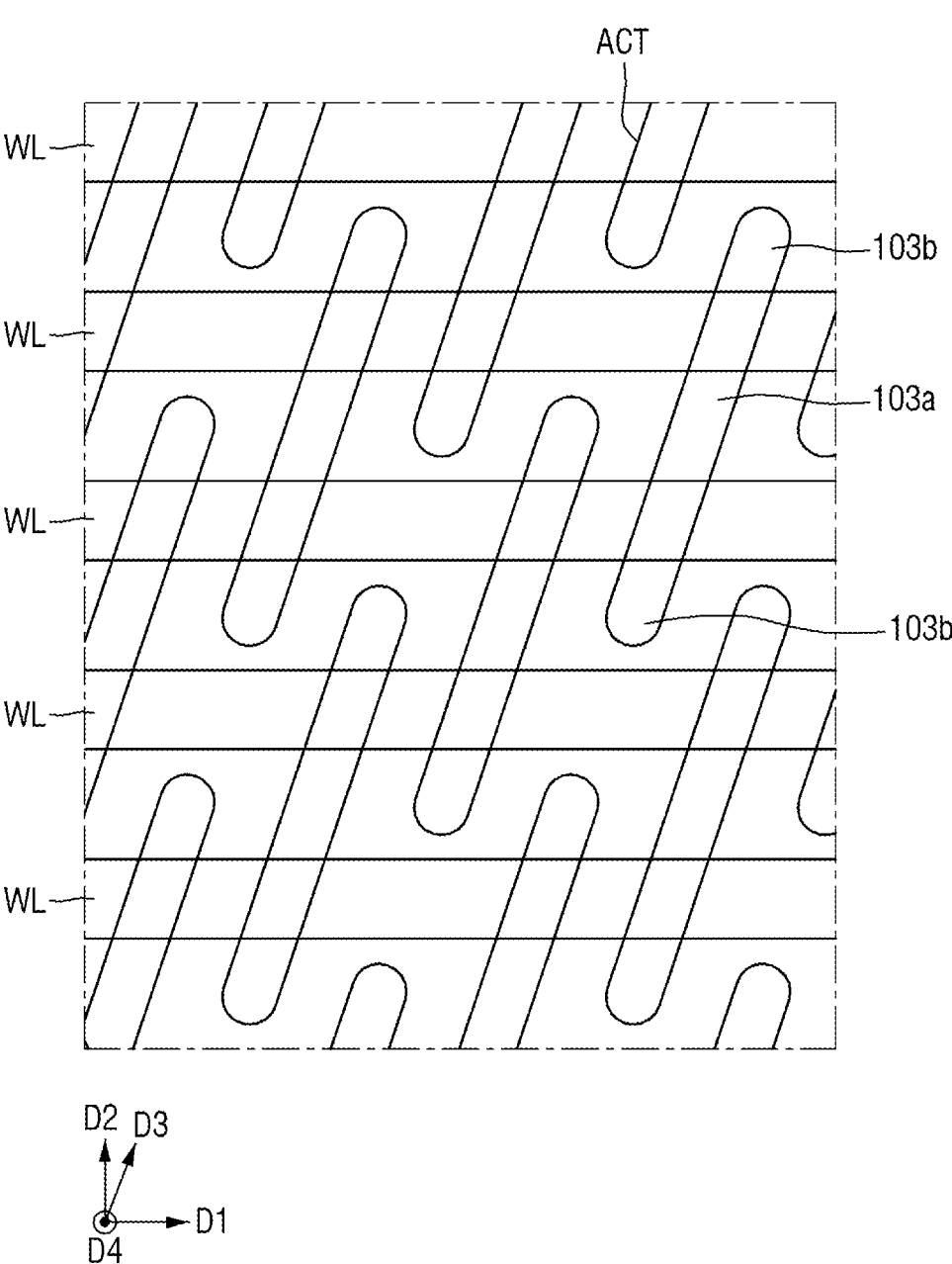
FIG. 3 is a layout view for describing a word line and an active region of FIG. 1.
Figure 4:
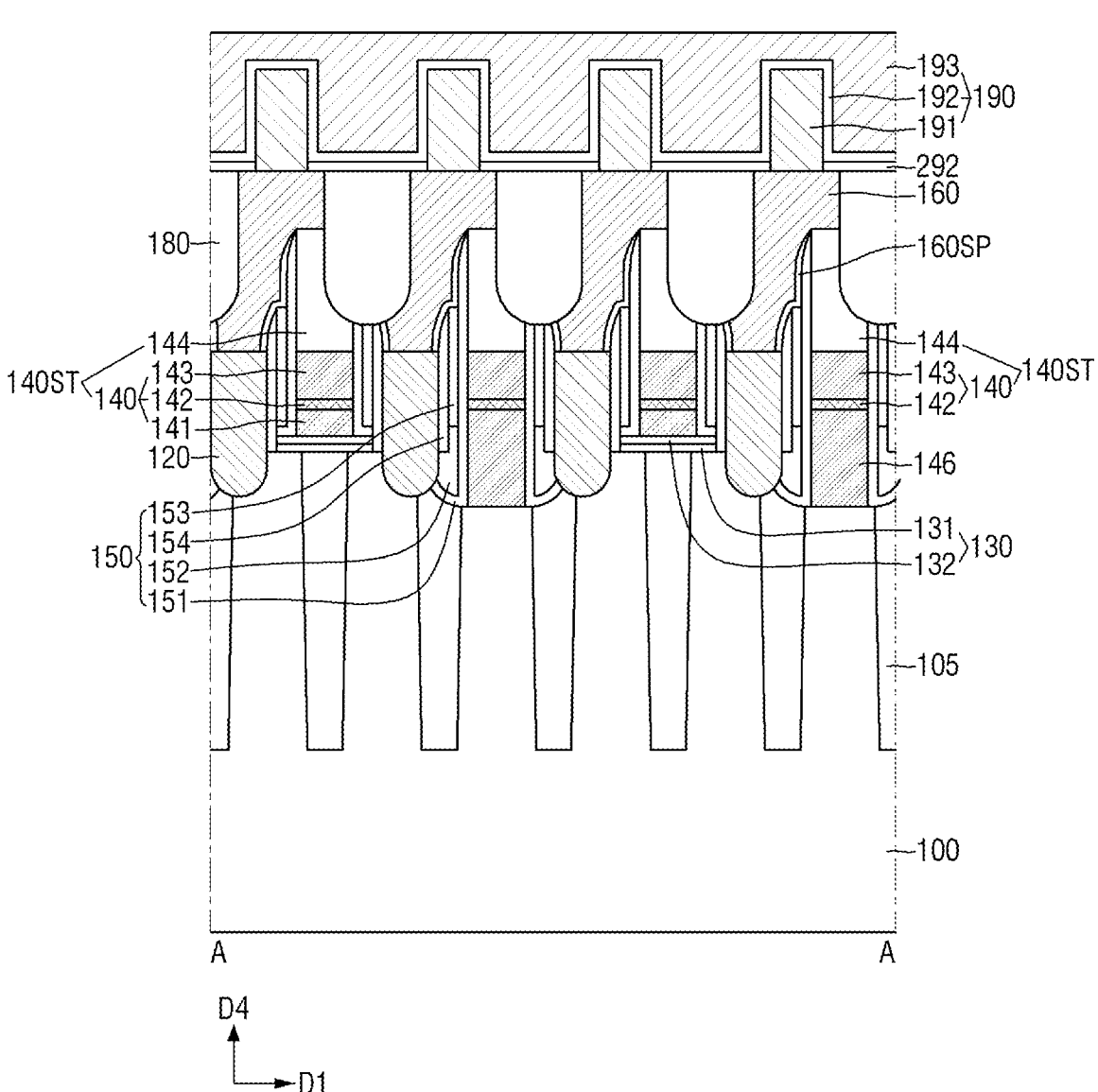
FIG. 4 is a cross-sectional view taken along line A-A of FIG. 1.
Figure 5:
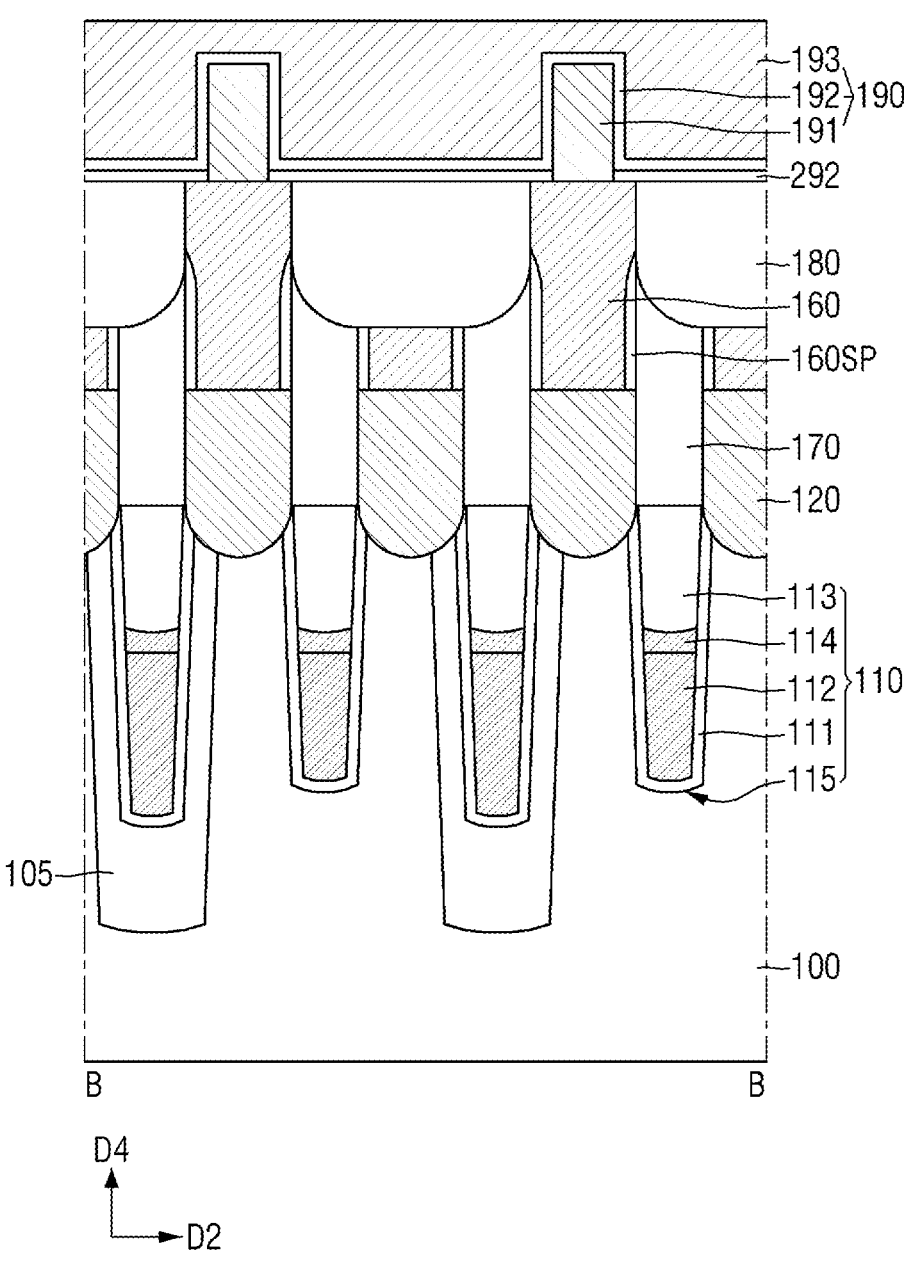
FIG. 5 is a cross-sectional view taken along line B-B of FIG. 1.
Figure 6:
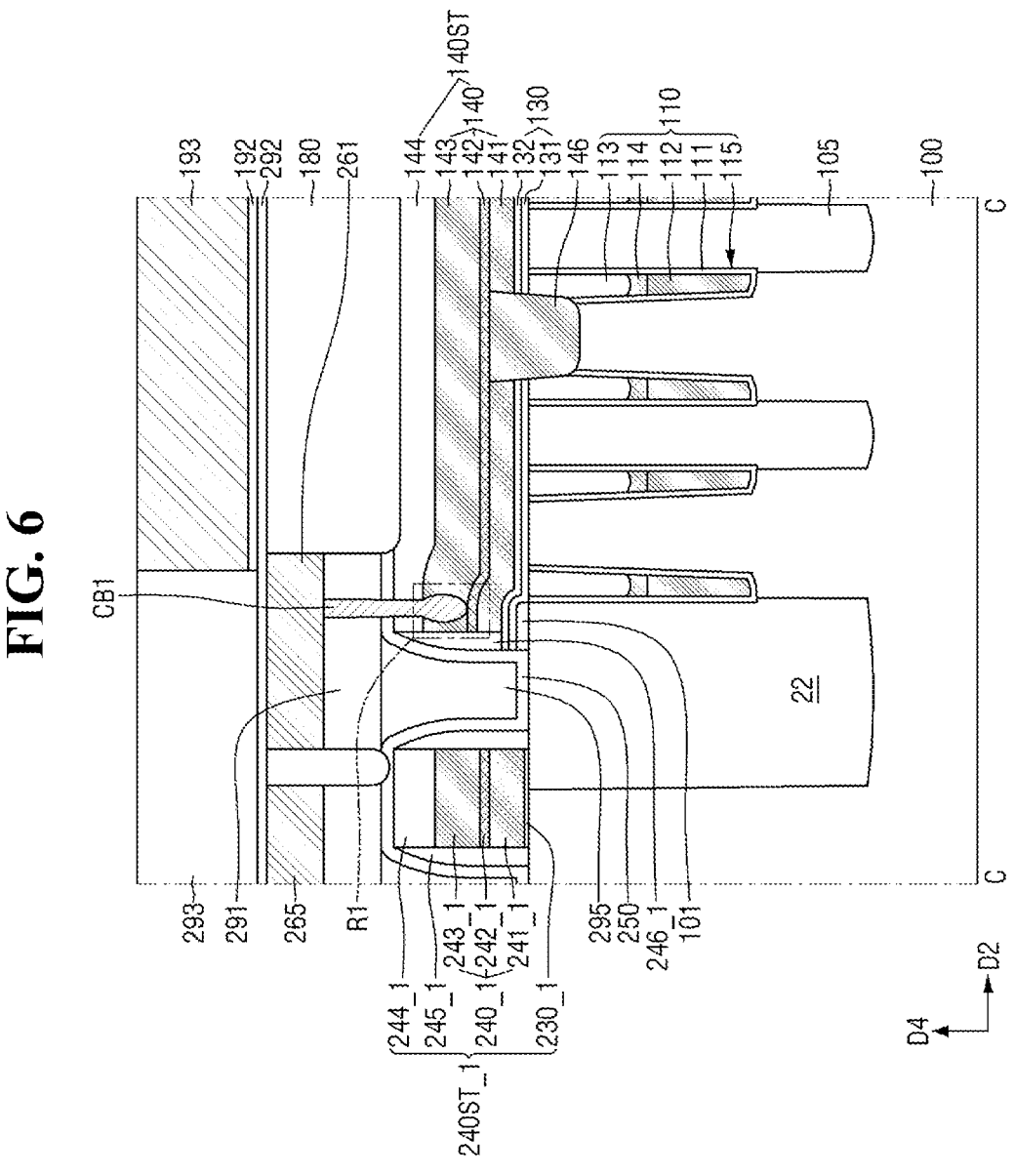
FIG. 6 is a cross-sectional view taken along line C-C of FIG. 2.
Figure 7:
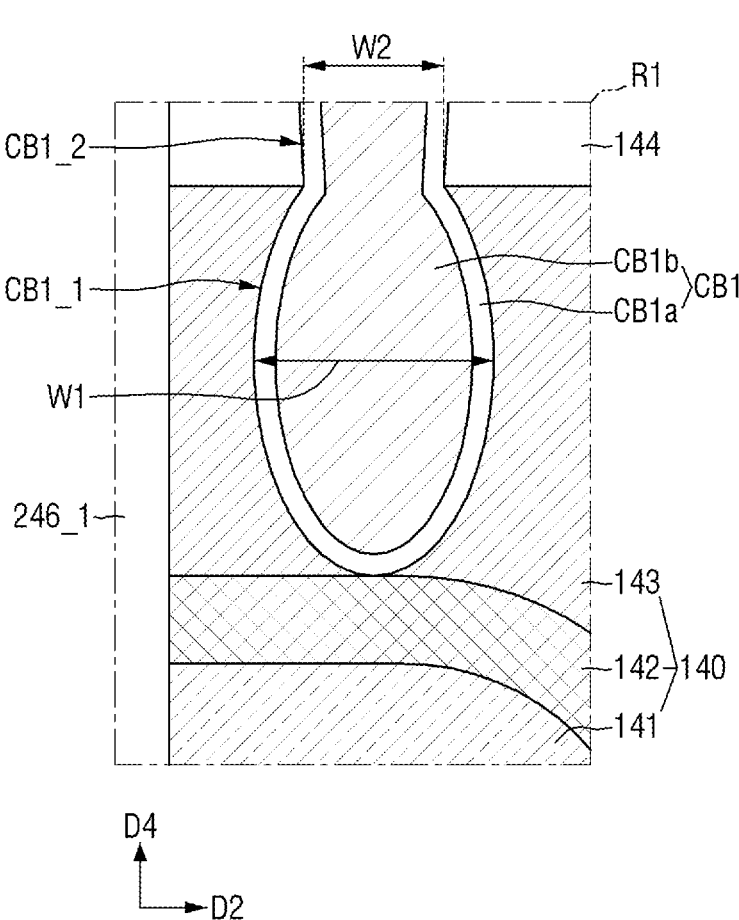
FIG. 7 is an enlarged view of region R1 of FIG. 6.
Figure 8:
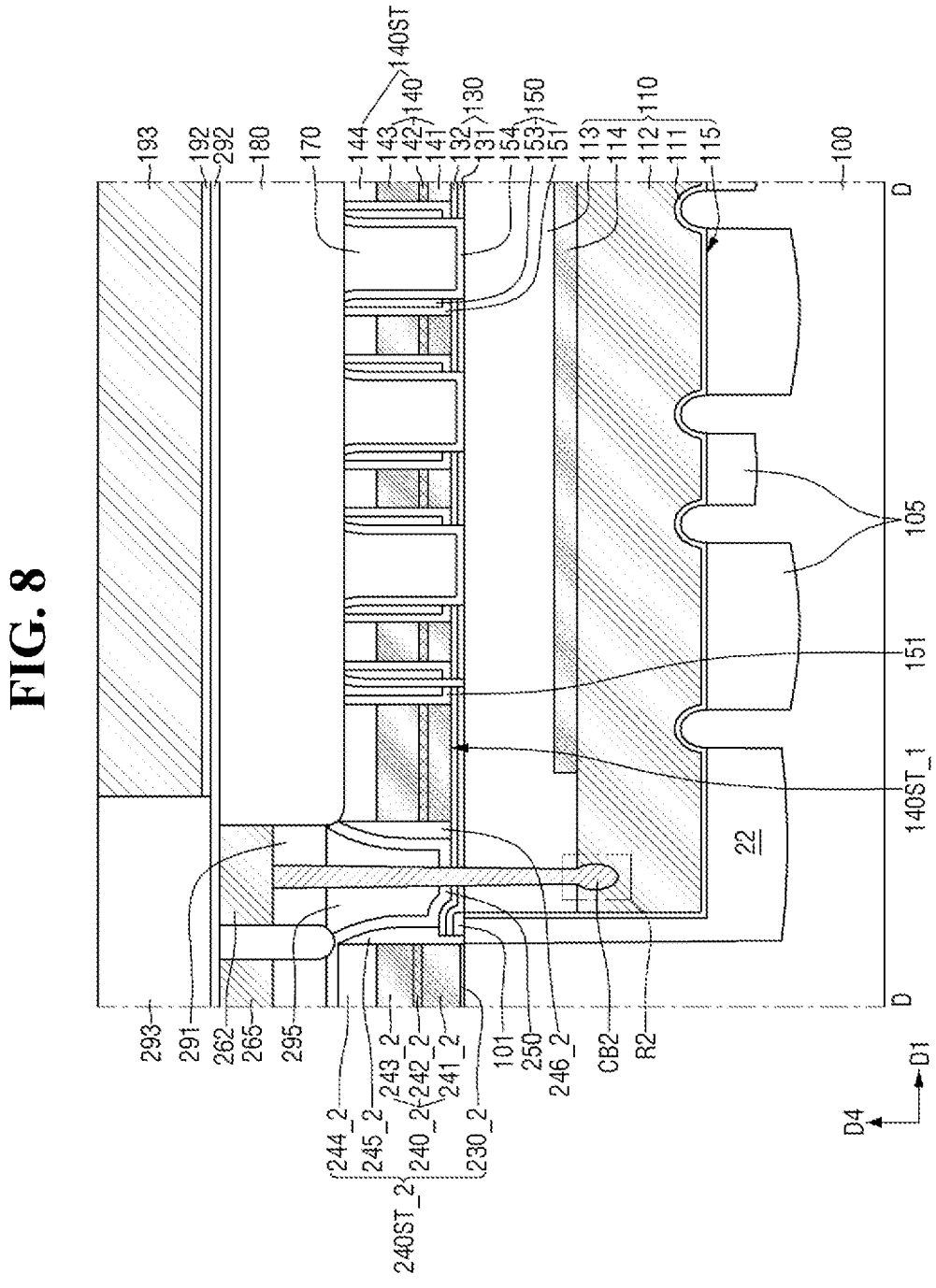
FIG. 8 is a cross-sectional view taken along line D-D of FIG. 2.
Figure 9:
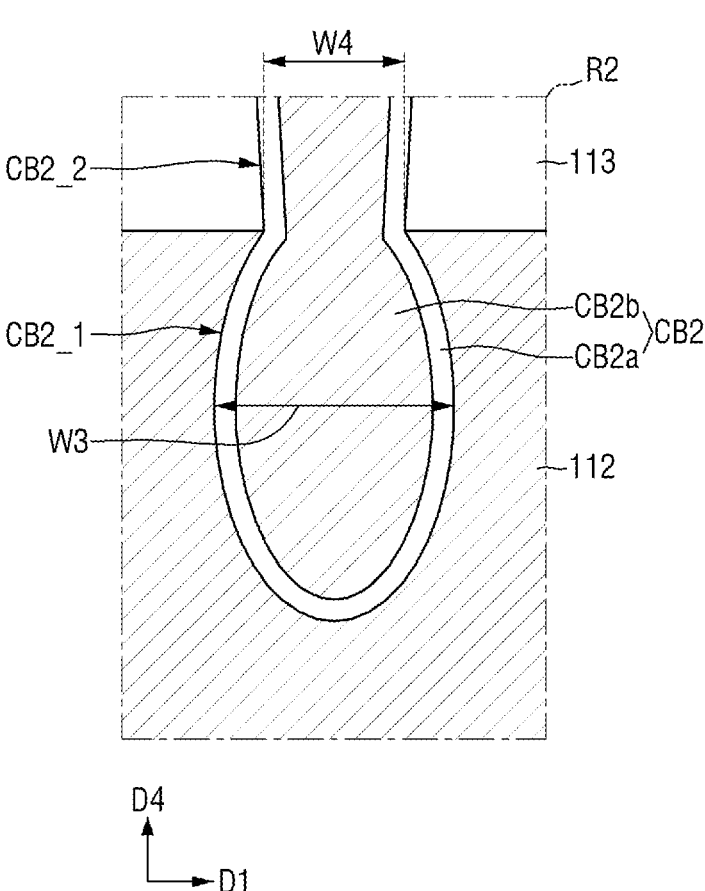
FIG. 9 is an enlarged view of region R2 of FIG. 8.
Figure 10:
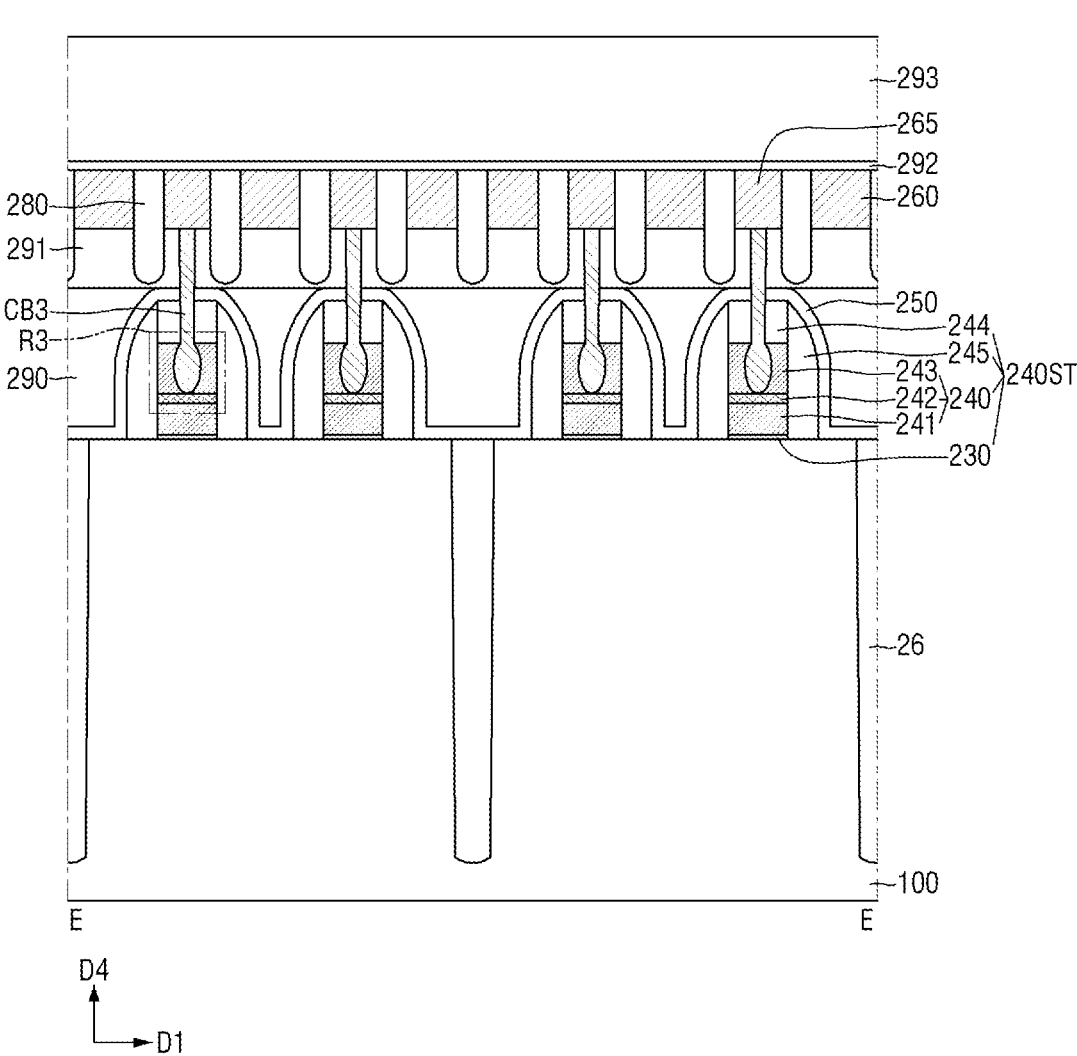
FIG. 10 is a cross-sectional view taken along line E-E of FIG. 2.
Figure 11:
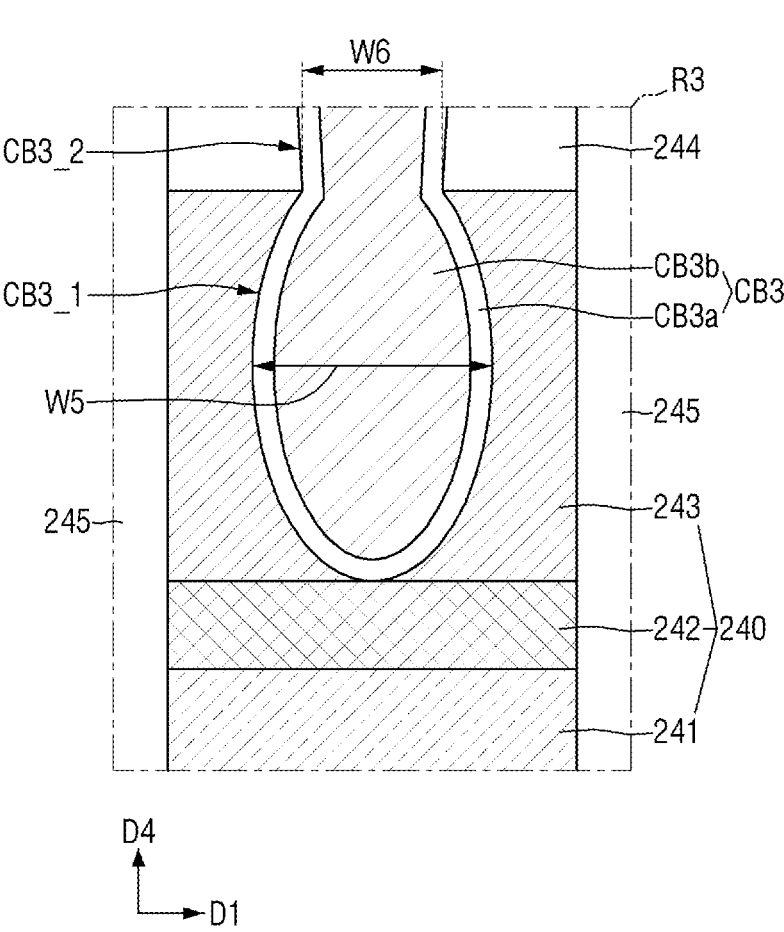
FIG. 11 is an enlarged view of region R3 of FIG. 10.

FIG. 1 is a schematic layout view for describing a cell region of a semiconductor memory device according to some exemplary embodiments of the present disclosure. FIG. 2 is a schematic layout view of a semiconductor memory device including the cell region of FIG. 1. FIG. 3 is a layout view for describing a word line and an active region of FIG. 1. FIG. 4 is a cross-sectional view taken along line A-A of FIG. 1. FIG. 5 is a cross-sectional view taken along line B-B of FIG. 1. FIG. 6 is a cross-sectional view taken along line C-C of FIG. 2. FIG. 7 is an enlarged view of region R1 of FIG. 6. FIG. 8 is a cross-sectional view taken along line D-D of FIG. 2. FIG. 9 is an enlarged view of region R2 of FIG. 8. FIG. 10 is a cross-sectional view taken along line E-E of FIG. 2. FIG. 11 is an enlarged view of region R3 of FIG. 10.

For reference, FIG. 6 may be a cross-sectional view taken along a bit line BL of FIG. 1 in a cell region separation layer 22. FIG. 7 may be a cross-sectional view taken along a word line WL of FIG. 1 in the cell region separation layer 22. FIG.

8 may be an exemplary cross-sectional view of a transistor formation region of a peripheral region.

Referring to FIGS. 1 to 3, a semiconductor memory device according to some exemplary embodiments may include a cell region 20, a cell region separation layer 22, and a peripheral region 24.

The cell region separation layer 22 may be formed along a periphery of the cell region 20. The cell region separation layer 22 may separate the cell region 20 and the peripheral region 24. The peripheral region 24 may be defined around the cell region 20.

The cell region 20 may include a plurality of cell active regions ACT. The cell active region ACT may be defined by a cell element separation layer (105 in FIG. 4) formed in a substrate (100 in FIG. 4). As a design rule of the semiconductor memory device is reduced, a pitch or distance between the cell active regions ACT may be reduced. In some embodiments, the cell active region ACT may be in a bar shape of a diagonal line or an oblique line as illustrated. For example, the cell active region ACT may extend in a third horizontal direction D3.

A plurality of gate electrodes may be in a first horizontal direction D1 across the cell active region ACT. The plurality of gate electrodes may extend to be parallel to each other. The plurality of gate electrodes may be, for example, a plurality of word lines WL. The word lines WL may be spaced or arranged at equal intervals. A width of the word lines WL or an interval between the word lines WL may be determined according to a design rule.

As seen in FIG. 3, each of the cell active regions ACT may be divided into three portions by two word lines WL extending in the first horizontal direction D1. The cell active region ACT may include a storage connection region 103*b* and a bit line connection region 103*a*. The bit line connection region 103*a* may be positioned at a central portion of the cell active region ACT, and the storage connection region 103*b* may be positioned at end portions of the cell active region ACT.

A plurality of bit lines BL extending in a second horizontal direction D2 orthogonal to the word lines WL may be on the word lines WL. The plurality of bit lines BL may extend in the second horizontal direction D2 to be parallel to each other. The bit lines BL may be spaced or arranged at equal intervals. A width of the bit lines BL or an interval between the bit lines BL may be determined according to a design rule.

The semiconductor memory device according to some exemplary embodiments of the present disclosure may include various contact arrangements formed on the cell active region ACT. Various contact arrangements may include, for example, a direct contact DC, a buried contact BC, and a landing pad LP.

Here, the direct contact DC may refer to a contact that electrically connects the cell active region ACT to the bit line BL. The buried contact BC may refer to a contact that connects the cell active region ACT to a lower electrode (191 in FIG. 4) of a capacitor. Due to an arrangement structure, a contact area between the buried contact BC and the cell active region ACT may be small. Accordingly, a conductive landing pad LP may be introduced to increase a contact area with the cell active region ACT and increase a contact area with the lower electrode (191 in FIG. 4) of the capacitor.

The landing pad LP may also be between the cell active region ACT and the buried contact BC, and may also be between the buried contact BC and the lower electrode (191 in FIG. 4) of the capacitor. In the semiconductor memory device according to some exemplary embodiments, the landing pad LP may be between the buried contact BC and the lower electrode of the capacitor. By increasing the contact area through the introduction of the landing pad LP, contact resistance between the cell active region ACT and the lower electrode of the capacitor may be reduced.

The direct contact DC may be connected to the bit line connection region 103*a*. The buried contact BC may be connected to the storage connection region 103*b*. As the buried contact BC is provided at both end portions of the cell active region ACT, the landing pad LP may be adjacent to both ends of the cell active region ACT, and may partially overlap the buried contact BC. In other words, the buried contact BC may be formed to overlap the cell active region ACT and the cell element separation layer (105 in FIG. 4) between two adjacent word lines WL and between two adjacent bit lines BL.

The word line WL may be formed in a structure buried in the substrate 100. The word line WL may extend across the cell active region ACT between the direct contacts DC or the buried contacts BC. As illustrated, two word lines WL may extend across one cell active region ACT. As the cell active region ACT extends along the third horizontal direction D3, the word line WL may have an angle of less than 90 degrees with the cell active region ACT.

The direct contact DC and the buried contact BC may be symmetrically arranged or provided. Accordingly, the direct contact DC and the buried contact BC may be provided on one straight line in the first horizontal direction D1 and the second horizontal direction D2. Meanwhile, unlike the direct contact DC and the buried contact BC, the landing pad LP may be provided in a zigzag shape in the second horizontal direction D2 in which the bit line BL extends. In addition, the landing pad LP may overlap the same side portion of each bit line BL in the first horizontal direction D1 in which the word line WL extends. For example, each of the landing pads LP of a first line may overlap a left side of a corresponding bit line BL, and each of the landing pads LP of a second line may overlap a right side of a corresponding bit line BL.

Referring to FIGS. 1 to 11, the semiconductor memory device according to some exemplary embodiments of the present disclosure may include a plurality of cell gate structures 110, a plurality of bit line gate structures 140ST, a plurality of storage contacts 120, an information storage portion 190, and a peripheral gate structure 240ST.

The substrate 100 may include a cell region 20, a cell region separation layer 22, and a peripheral region 24. In some embodiments, the substrate 100 may be a silicon substrate or a silicon-on-insulator (SOI). In some embodiments, the substrate 100 may include silicon germanium, silicon germanium on insulator (SGOI), indium antimonide, a lead tellurium compound, indium arsenide, indium phosphide, gallium arsenide, and/or gallium antimonide, but the present disclosure is not limited thereto.

The plurality of cell gate structures 110, the plurality of bit line gate structures 140ST, the plurality of storage contacts 120, and the information storage portion 190 may be provided in the cell region 20. The peripheral gate structure 240ST may be provided in the peripheral region 24.

The cell element separation layer 105 may be formed in the substrate 100 of the cell region 20. The cell element separation layer 105 may have a shallow trench isolation (STI) structure having excellent element separation characteristics. The cell element separation layer 105 may define a cell active region ACT in the cell region 20. The cell active region ACT defined by the cell element separation layer 105 may have a long island shape including a short axis and a long axis as illustrated in FIG. 1. The cell active region ACT may have an oblique shape to have an angle of less than 90 degrees with respect to the word line WL formed in the cell element separation layer 105. In addition, the cell active region ACT may have an oblique shape to have an angle of less than 90 degrees with respect to the bit line BL formed on the cell element separation layer 105.

A cell boundary separation film (not shown) having an STI structure may also be formed in the cell region separation layer 22. The cell region 20 may be defined by the cell region separation layer 22. The cell element separation layer 105 and the cell region separation layer 22 may each include, for example, at least one of a silicon oxide film, a silicon nitride film, and a silicon oxynitride film, but the present disclosure is not limited thereto. Although it is illustrated in the drawings that each of the cell element separation layer 105 and the cell region separation layer 22 is formed as a single insulating film, this is only for convenience of explanation, and the present disclosure is not limited thereto. Depending on a width of the cell element separation layer 105 and the cell region separation layer 22, each of the cell element separation layer 105 and the cell region separation layer 22 may also be formed as a single insulating film or as a plurality of insulating films.

Although it is illustrated in FIGS. 6 and 8 that an upper surface of the cell element separation layer 105, an upper surface of the substrate 100, and an upper surface of the cell region separation layer 22 are each formed on the same plane, this is only for convenience of explanation, the present disclosure is not limited thereto.

The cell gate structure 110 may be formed in the substrate 100 and the cell element separation layer 105. The cell gate structure 110 may be formed across the cell element separation layer 105 and the cell active region ACT defined by the cell element separation layer 105. The cell gate structure 110 may include a cell gate trench 115, a cell gate insulating layer 111, a cell gate electrode 112, a cell gate capping layer 113, and a cell gate capping conductive layer 114 which are formed in the substrate 100 and the cell element separation layer 105. Here, the cell gate electrode 112 may correspond to the word line WL. In some embodiments, and in contrast to that illustrated in FIGS. 1 to 11, the cell gate structure 110 may not include the cell gate capping conductive layer 114.

The cell gate insulating layer 111 may extend along a sidewall and a bottom surface of the cell gate trench 115. The cell gate insulating layer 111 may extend along a profile of at least a portion of the cell gate trench 115. The cell gate insulating layer 111 may include, for example, at least one of silicon oxide, silicon nitride, silicon oxynitride, or a high-k material having a dielectric constant higher than that of silicon oxide. The high-k material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and/or combinations thereof.

The cell gate electrode 112 may be formed on the cell gate insulating layer 111. The cell gate electrode 112 may fill a portion of the cell gate trench 115. The cell gate capping conductive layer 114 may extend along an upper surface of the cell gate electrode 112. Although it is illustrated in FIG. 8 that the cell gate capping conductive layer 114 does not cover a portion of the upper surface of the cell gate electrode 112, the present disclosure is not limited thereto.

The cell gate electrode 112 may include at least one of a metal, a metal alloy, conductive metal nitride, conductive metal carbonitride, conductive metal carbide, metal silicide, a doped semiconductor material, conductive metal oxynitride, and conductive metal oxide. The cell gate electrode 112 may include, for example, at least one of TiN, TaC, TaN, TiSiN, TaSiN, TaTiN, TiAlN, TaAlN, WN, Ru, TiAl, TiAlC-N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx, and/or combinations thereof, but the present disclosure is not limited thereto. The cell gate capping conductive layer 114 may include, for example, polysilicon or polysilicon germanium, but the present disclosure is not limited thereto.

The cell gate capping layer 113 may be on the cell gate electrode 112 and the cell gate capping conductive layer 114. In some embodiments, the cell gate capping layer 113 may fill a portion of the cell gate trench 115 that remains after the cell gate electrode 112 and the cell gate capping conductive layer 114 are formed. Although it is illustrated that the cell gate insulating layer 111 extends along a sidewall of the cell gate capping layer 113, the present disclosure is not limited thereto. The cell gate capping layer 113 may include, for example, at least one of silicon nitride (SiN), silicon oxynitride (SiON), silicon oxide (SiO$_2$), silicon carbonitride (SiCN), silicon oxycarbonitride (SiOCN), and/or combinations thereof.

Although not illustrated, an impurity doped region may be formed on at least one side of the cell gate structure 110. The impurity doped region may be a source/drain region of a transistor.

The bit line gate structure 140ST may include a cell conductive line 140 and a cell line capping layer 144. The cell conductive line 140 may be formed on the substrate 100 in which the cell gate structure 110 is formed and the cell element separation layer 105. The cell conductive line 140 may intersect the cell element separation layer 105 and the cell active region ACT defined by the cell element separation layer 105. The cell conductive line 140 may be formed to intersect the cell gate structure 110. Here, the cell conductive line 140 may correspond to the bit line BL.

The cell conductive line 140 may be multiple films. The cell conductive line 140 may include, for example, a first cell conductive layer 141, a second cell conductive layer 142, and a third cell conductive layer 143. The first to third cell conductive layers 141, 142, and 143 may be sequentially stacked on the substrate 100 and the cell element separation layer 105. The cell conductive line 140 is illustrated as a triple layer, but the present disclosure is not limited thereto.

The first to third cell conductive layers 141, 142, and 143 may include different materials. The first cell conductive layer 141 may include, for example, a doped semiconductor material. For example, the first cell conductive layer 141 may include polysilicon. In some other exemplary embodiments, the first cell conductive layer 141 may include, for example, at least one of silicon oxide, silicon nitride, silicon oxynitride, or a high-k material having a dielectric constant higher than that of silicon oxide.

The second cell conductive layer 142 may include, for example, at least one of a conductive silicide compound and conductive metal nitride. For example, the second cell conductive layer 142 may include titanium silicon nitride (TiSiN). The third cell conductive layer 143 may include, for example, at least one of a metal and a metal alloy. For example, the third cell conductive layer 143 may include tungsten (W).

A bit line contact 146 may be formed between the cell conductive line 140 and the substrate 100. That is, the cell conductive line 140 may be formed on the bit line contact 146. For example, the bit line contact 146 may be in contact with the second cell conductive layer 142. The bit line contact 146 may extend through the first cell conductive layer 141 and extend into the substrate 100. For example, the bit line contact 146 may be formed at a point where the cell conductive line 140 intersects a central portion of the cell active region ACT having a long and/or island shape. The bit line contact 146 may be formed between the bit line connection region 103a and the cell conductive line 140.

The bit line contact 146 may electrically connect the cell conductive line 140 and the substrate 100 to each other. Here, the bit line contact 146 may correspond to the direct contact DC. The bit line contact 146 may include, for example, at least one of a semiconductor material doped with impurities, a conductive silicide compound, conductive metal nitride, and/or a metal.

In FIG. 4, in a region overlapping the upper surface of the bit line contact 146, the cell conductive line 140 may include the second cell conductive layer 142 and the third cell conductive layer 143. In a region that does not overlap the upper surface of the bit line contact 146, the cell conductive line 140 may include the first to third cell conductive layers 141, 142, and 143.

The cell line capping layer 144 may be on the cell conductive line 140. The cell line capping layer 144 may extend in the second horizontal direction D2 along the upper surface of the cell conductive line 140. The cell line capping layer 144 may include, for example, at least one of silicon nitride, silicon oxynitride, silicon carbonitride, and/or silicon oxycarbonitride. Although it is illustrated in the drawings that the cell line capping layer 144 is a single film, the present disclosure is not limited thereto.

The cell insulating layer 130 may be formed on the substrate 100 and the cell element separation layer 105. The cell insulating layer 130 may be on the substrate 100 and the cell element separation layer 105 on regions on which the bit line contact 146 is not formed. In some embodiments, the cell insulating layer 130 may be between adjacent bit line contacts 146 in the first horizontal direction D1. The cell insulating layer 130 may be between the substrate 100 and the cell conductive line 140 and between the cell element separation layer 105 and the cell conductive line 140.

The cell insulating layer 130 may be a single layer, but as illustrated, the cell insulating layer 130 may also be multiple layers including a first cell insulating layer 131 and a second cell insulating layer 132. For example, the first cell insulating layer 131 may include a silicon oxide film, and the second cell insulating layer 132 may include a silicon nitride layer, but the present disclosure is not limited thereto.

The cell buffer layer 101 may be between the cell insulating layer 130 and the cell region separation layer 22. The cell buffer layer 101 may include, for example, a silicon oxide film, but the present disclosure is not limited thereto.

The cell line spacer 150 may be on sidewalls of the cell conductive line 140 and the cell line capping layer 144. The cell line spacer 150 may be in contact with a sidewall of each of the first to third cell conductive layers 141, 142, and 143 and the cell line capping layer 144. In the portion of the cell conductive line 140 where the bit line contact 146 is formed, the cell line spacer 150 may be formed on the substrate 100 and the cell element separation layer 105. The cell line spacer 150 may be on the sidewalls of the cell conductive line 140, the cell line capping layer 144, and the bit line contact 146.

In portions of the cell conductive line 140 where the bit line contact 146 is not formed, the cell line spacer 150 may be on the cell insulating layer 130. The cell line spacer 150 may be on the sidewalls of the cell conductive line 140 and the cell line capping layer 144.

The cell line spacer 150 may be a single layer, but as illustrated, the cell line spacer 150 may be multiple layers including first to fourth cell line spacers 151, 152, 153, and 154. For example, the first to fourth cell line spacers 151, 152, 153, and 154 may include, for example, one of a silicon oxide film, a silicon nitride film, a silicon oxynitride film (SiON), a silicon oxycarbonitride film (SiOCN), air, and/or combinations thereof, but the present disclosure is not limited thereto.

For example, the second cell line spacer 152 may not be provided on the cell insulating layer 130, but may be on the sidewall of the bit line contact 146. In FIG. 8, on the upper surface of the cell gate structure 110, the fourth cell line spacer 154 may extend along the sidewall of the cell conductive line 140 adjacent in the first horizontal direction D1 and the upper surface of the cell gate capping layer 113.

In FIG. 6, the bit line gate structure 140ST may extend in length in the second horizontal direction D2 and have relatively longer sidewalls (or long sidewall) thereof that extend in the second horizontal direction D2. The bit line gate structure 140ST may include a relatively shorter sidewall (or short sidewall) defined on the cell region separation layer 22. A first cell boundary spacer 246_1 may be on the short sidewall of the bit line gate structure 140ST. That is, the cell line spacer 150 may be on a long sidewall extending in length in the second horizontal direction D2 among sidewalls of the bit line gate structure 140ST. The first cell boundary spacer 246_1 may be in contact with the sidewall of each of the first to third cell conductive layers 141, 142, and 143 and the cell line capping layer 144.

In FIG. 8, a dummy bit line gate structure 140ST_1 may be on the cell region separation layer 22. The dummy bit line gate structure 140ST_1 may have the same structure as the bit line gate structure 140ST. That is, the dummy bit line gate structure 140ST_1 may include the cell conductive line 140 and the cell line capping layer 144.

The first cell line spacer 151 and the third cell line spacer 153 may be formed on a first sidewall of the dummy bit line gate structure 140ST_1 that faces the bit line gate structure 140ST. A second cell boundary spacer 246_2 may be on a second sidewall of the dummy bit line gate structure 140ST_1 opposite to the first sidewall in the first horizontal direction D1. The second cell boundary spacer 246_2 may be in contact with the sidewall of each of the first to third cell conductive layers 141, 142, and 143 and the cell line capping layer 144.

The second cell boundary spacer 246_2 and the first cell boundary spacer 246_1 may be formed at the same level as a peripheral spacer 245, a first block spacer 245_1, and a second block spacer 245_2 described later. Herein, the term "same level" may refer to formation by the same manufacturing process.

A fence pattern 170 may be on the substrate 100 and the cell element separation layer 105. The fence pattern 170 may be formed to overlap the cell gate structure 110 formed in the substrate 100 and the cell element separation layer 105. The fence pattern 170 may be between the bit line gate structures 140ST extending in the second horizontal direction D2. The fence pattern 170 may include, for example, at least one of silicon oxide, silicon nitride, silicon oxynitride, and/or combinations thereof.

The storage contact 120 may be between the cell conductive lines 140 adjacent to each other in the first horizontal direction D1. The storage contact 120 may be between the fence patterns 170 adjacent to each other in the second horizontal direction D2. The storage contact 120 may overlap the substrate 100 and the cell element separation layer 105 between the cell conductive lines 140 adjacent to each other.

The storage contact 120 may be connected to the storage connection region 103b of the cell active region ACT. Here, the storage contact 120 may correspond to the buried contact BC. The storage contact 120 may include, for example, at least one of a semiconductor material doped with impurities, a conductive silicide compound, conductive metal nitride, and/or a metal.

A storage pad 160 may be formed on the storage contact 120. The storage pad 160 may be electrically connected to the storage contact 120. Here, the storage pad 160 may correspond to the landing pad LP. The storage pad 160 may overlap a portion of an upper surface of the bit line gate structure 140ST. The storage pad 160 may include, for example, at least one of a semiconductor material doped with impurities, a conductive silicide compound, conductive metal nitride, conductive metal carbide, a metal, and a metal alloy.

A storage pad spacer 160SP may be on the storage contact 120. The storage pad spacer 160SP may be between the storage pad 160 and the bit line gate structure 140ST and between the storage pad 160 and the fence pattern 170. In some embodiments, and in contrast to that which is illustrated in the figures, the storage pad spacer 160SP may be omitted. The storage pad spacer 160SP may include, for example, at least one of a silicon oxide film, a silicon nitride film, a silicon oxynitride film, a silicon oxycarbonitride film, and/or a silicon carbonitride film (SiCN).

A pad separation insulating layer 180 may be formed on the storage pad 160 and the bit line gate structure 140ST. For example, the pad separation insulating layer 180 may be on the cell line capping layer 144. The pad separation insulating layer 180 may define a region of the storage pad 160 forming a plurality of isolated regions. In addition, the pad separation insulating layer 180 may not cover the upper surface of the storage pad 160.

The pad separation insulating layer 180 may include an insulating material to electrically separate the plurality of storage pads 160 from each other. For example, the pad separation insulating layer 180 may include, for example, at least one of a silicon oxide film, a silicon nitride film, a silicon oxynitride film, a silicon oxycarbonitride film, and/or a silicon carbonitride film.

A first etching stop layer 292 may be on the pad separation insulating layer 180 and the storage pad 160. The first etching stop layer 292 may extend not only to the cell region 20 but also to the peripheral region 24. The first etching stop layer 292 may include at least one of a silicon nitride film, a silicon carbonitride film, a silicon boron nitride film (SiBN), a silicon oxynitride film, and/or a silicon oxycarbide film.

The information storage portion 190 may be on the storage pad 160. The information storage portion 190 may be electrically connected to the storage pad 160. A portion of the information storage portion 190 may be in the first etching stop layer 292. The information storage portion 190 may include, for example, a capacitor, but the present disclosure is not limited thereto. The information storage portion 190 may include a first lower electrode 191, a first capacitor dielectric layer 192, and a first upper electrode 193.

The first lower electrode 191 may be on the storage pad 160. Although it is illustrated that the first lower electrode 191 has a pillar shape, the present disclosure is not limited thereto. In some other exemplary embodiments, the first lower electrode 191 may have a cylindrical shape. The first capacitor dielectric layer 192 may be formed on the first lower electrode 191. The first capacitor dielectric layer 192 may be formed along a profile of the first lower electrode 191. The first upper electrode 193 may be formed on the first capacitor dielectric layer 192. The first upper electrode 193 may surround an outer sidewall of the first lower electrode 191.

The first capacitor dielectric layer 192 may be at a portion vertically overlapping the first upper electrode 193. However, the present disclosure is not limited thereto. In some other exemplary embodiments, the first capacitor dielectric layer 192 may include a first portion vertically overlapping the first upper electrode 193 and a second portion that does not vertically overlap the first upper electrode 193. That is, the second portion of the first capacitor dielectric layer 192 may be a portion that is not covered by the first upper electrode 193.

Each of the first lower electrode 191 and the first upper electrode 193 may include, for example, a doped semiconductor material, conductive metal nitride (e.g., titanium nitride, tantalum nitride, niobium nitride, tungsten nitride, or the like), a metal (e.g., ruthenium, iridium, titanium, tantalum, or the like), conductive metal oxide (e.g., iridium oxide, niobium oxide, or the like), or the like. However, the present disclosure is not limited thereto.

The first capacitor dielectric layer 192 may include, for example, one of silicon oxide, silicon nitride, silicon oxynitride, a high-k material, and/or a combination thereof, but the present disclosure is not limited thereto. In some exemplary embodiments, the first capacitor dielectric layer 192 may include a stacked film structure in which zirconium oxide, aluminum oxide, and zirconium oxide are sequentially stacked. In some other exemplary embodiments, the first capacitor dielectric layer 192 may include a dielectric film including hafnium (Hf). In some still other exemplary embodiments, the first capacitor dielectric layer 192 may have a stacked film structure of a ferroelectric material film and a paraelectric material film.

A peripheral element separation layer 26 may be formed in the substrate 100 of the peripheral region 24. The peripheral element separation layer 26 may define a peripheral active region in the peripheral region 24. Although it is illustrated that an upper surface of the peripheral element separation layer 26 is on or at the same plane as the upper surface of the substrate 100, the present disclosure is not limited thereto. The peripheral element separation layer 26 may include, for example, at least one of a silicon oxide film, a silicon nitride film, and/or a silicon oxynitride film, but the present disclosure is not limited thereto.

The peripheral gate structure 240ST may be on the substrate 100 in the peripheral region 24. The peripheral gate structure 240ST may be on the peripheral active region defined by the peripheral element separation layer 26. The peripheral gate structure 240ST may include a peripheral gate insulating layer 230, a peripheral gate conductive layer 240, and a peripheral capping layer 244 sequentially stacked on the substrate 100. The peripheral gate structure 240ST may include a peripheral spacer 245 on a sidewall of the peripheral gate conductive layer 240 and a sidewall of the peripheral capping layer 244. The peripheral spacer 245 may be in contact with the sidewall of each of the peripheral gate insulating layer 230, the peripheral gate conductive layer 240, and the peripheral capping layer 244. That is, the peripheral spacer 245 may be in contact with the sidewall of each of the first to third peripheral conductive layers 241, 242, and 243.

Although it is illustrated that two peripheral gate structures 240ST are between the peripheral element separation layers 26 adjacent to each other, this may be for convenience of explanation and the present disclosure is not limited thereto.

As seen in FIG. 6, a first block gate structure 240ST_1 may be between the cell region 20 and the peripheral region 24. Although it is illustrated that a portion of the first block gate structure 240ST_1 overlaps the cell region separation layer 22, the present disclosure is not limited thereto. The first block gate structure 240ST_1 may be a conductive structure that is closest in the second horizontal direction D2 to the bit line gate structure 140ST extending in the second horizontal direction D2.

The first block gate structure 240ST_1 may include a first block gate insulating layer 230_1, a first block conductive line 2401, and a first block capping layer 244_1 sequentially stacked on the substrate 100. The first block gate structure 240ST_1 may include a first block spacer 245_1 on a sidewall of the first block conductive line 240_1 and a sidewall of the first block capping layer 2441. The first block spacer 245_1 may be in contact with a sidewall of each of the first block gate insulating layer 230_1, the first block conductive line 240_1, and the first block capping layer 244_1.

The first block conductive line 2401 may include first to third first block conductive layers 241_1, 242_1, and 243_1, which may be referred to herein as first_first to first_third block conductive layers 241_1, 242_1, and 243_1. The first_first to first_third block conductive layers 241_1, 242_1, and 243_1 may be sequentially stacked on the first block gate insulating layer 230_1. A stacked film structure of the first block conductive line 240_1 between the first block gate insulating layer 230_1 and the first block capping layer 244_1 may be the same as that of the peripheral gate conductive layer 240.

As seen in FIG. 8, a second block gate structure 240ST_2 may be between the cell region 20 and the peripheral region 24. Although it is illustrated that a portion of the second block gate structure 240ST_2 overlaps the cell region separation layer 22, the present disclosure is not limited thereto. The second block gate structure 240ST_2 may be a conductive structure that is closest in the first horizontal direction D1 to the dummy bit line gate structure 140ST_1.

The second block gate structure 240ST_2 may include a second block gate insulating layer 230_2, a second block conductive line 240_2, and a second block capping layer 244_2 sequentially stacked on the substrate 100. The second block gate structure 240ST_2 may include a second block spacer 2452 on a sidewall of the second block conductive line 240_2 and a sidewall of the second block capping layer 2442. The second block spacer 245_2 may be in contact with a sidewall of each of the second block gate insulating layer 230_2, the second block conductive line 240_2, and the second block capping layer 244_2.

The second block conductive line 240_2 may include first to third second conductive block layers 241_2, 242_2, and 243_2, which may be referred to herein as second_first to second_third block conductive layers 241_2, 242_2, and 243_2. The second_first to second_third block conductive layers 241_2, 242_2, and 243_2 may be sequentially stacked on the second block gate insulating layer 230_2. A stacked film structure of the second block conductive line 240_2 between the second block gate insulating layer 230_2 and the second block capping layer 244_2 may be the same as that of the peripheral gate conductive layer 240.

The peripheral gate structure 240ST, the first block gate structure 240ST_1, and the second block gate structure 240ST_2 may be formed at the same level. The peripheral gate conductive layer 240, the first block conductive line 2401, and the second block conductive line 240_2 may have the same stacked structure as the cell conductive line 140. For example, a thickness of the peripheral gate conductive layer 240 may be the same as a thickness of the cell conductive line 140.

Each of the first peripheral conductive layer 241, the first_first block conductive layer 241_1, and the second_first block conductive layer 241_2 may include the same material as the first cell conductive layer 141. Each of the second peripheral conductive layer 242, the first_second block conductive layer 2421, and the second_second block conductive layer 242_2 may include the same material as the second cell conductive layer 142. Each of the third peripheral conductive layer 243, the first_third block conductive layer 243_1, and the second_third block conductive layer 243_2 may include the same material as the third cell conductive layer 143.

For example, the first to third peripheral conductive layers 241, 242, and 243 may include different materials. Each of the first peripheral conductive layer 241, the first_first block conductive layer 2411, and the second_first block conductive layer 241_2 may include, for example, a doped semiconductor material. For example, each of the first peripheral conductive layer 241, the first_first block conductive layer 2411, and the second_first block conductive layer 241_2 may include polysilicon. In some other exemplary embodiments, each of the first peripheral conductive layer 241, the first_first block conductive layer 241_1, and the second_first block conductive layer 241_2 may include, for example, at least one of silicon oxide, silicon nitride, silicon oxynitride, and/or a high-k material having a dielectric constant higher than that of silicon oxide.

Each of the second peripheral conductive layer 242, the first_second block conductive layer 2421, and the second_second block conductive layer 242_2 may include, for example, at least one of a conductive silicide compound and/or a conductive metal nitride. For example, each of the second peripheral conductive layer 242, the first_second block conductive layer 2421, and the second_second block conductive layer 2422 may include titanium silicon nitride (TiSiN). Each of the third peripheral conductive layer 243, the first_third block conductive layer 2431, and the second_third block conductive layer 243_2 may include, for example, at least one of a metal and/or a metal alloy. For example, each of the third peripheral conductive layer 243, the first_third block conductive layer 2431, and the second_third block conductive layer 243_2 may include tungsten (W).

Each of the peripheral gate insulating layer 230, the first block gate insulating layer 230_1, and the second block gate insulating layer 2302 may include the same material. Each of the peripheral gate insulating layer 230, the first block gate insulating layer 2301, and the second block gate insulating layer 230_2 may include, for example, silicon oxide, silicon nitride, silicon oxynitride, or a high-k material having a higher dielectric constant than that of silicon oxide.

Each of the peripheral spacer 245, the first block spacer 245_1, and the second block spacer 245_2 may include the same material. Each of the peripheral spacer 245, the first block spacer 245_1, and the second block spacer 245_2 may include, for example, at least one of silicon nitride, silicon oxynitride, silicon oxide, silicon carbonitride, silicon oxycarbonitride, and/or a combination thereof. Although it is illustrated that each of the peripheral spacer 245, the first block spacer 245_1, and the second block spacer 245_2 is a single film, this may be for convenience of explanation and the present disclosure is not limited thereto. Each of the peripheral spacer 245, the first block spacer 245_1, and the second block spacer 245_2 may be multiple films.

Each of the peripheral capping layer 244, the first block capping layer 2441, and the second block capping layer 244_2 may include the same material. Each of the peripheral capping layer 244, the first block capping layer 2441, and the second block capping layer 244_2 may include, for example, at least one of silicon nitride, silicon oxynitride, and silicon oxide.

A second etching stop layer 250 may be on the substrate 100. The second etching stop layer 250 may be formed along a profile of the peripheral gate structure 240ST, a profile of the first block gate structure 240ST_1, and a profile of the second block gate structure 240ST_2, respectively. The second etching stop layer 250 may extend along a sidewall of each of the first cell boundary spacer 246_1 and the second cell boundary spacer 246_2. The second etching stop layer 250 may include, for example, at least one of silicon nitride, silicon oxynitride, silicon carbonitride, and/or silicon oxycarbonitride.

A first peripheral interlayer insulating layer 290 may be on the second etching stop layer 250. The first peripheral interlayer insulating layer 290 may be around the peripheral gate structure 240ST.

A cell interlayer insulating layer 295 may be on the second etching stop layer 250. For example, the cell interlayer insulating layer 295 may be on the cell region separation layer 22. The cell interlayer insulating layer 295 may be between the first block gate structure 240ST_1 and the bit line gate structure 140ST and between the second block gate structure 240ST_2 and the dummy bit line gate structure 140ST_1. The cell interlayer insulating layer 295 may be between the cell conductive line 140 and the first block conductive line 240_1 facing in the second horizontal direction D2 and between the second block conductive line 240_2 and the cell conductive line of the dummy bit line gate structure 140ST_1 facing in the first horizontal direction D1. The cell interlayer insulating layer 295 may be around the bit line gate structure 140ST and the dummy bit line gate structure 140ST_1.

The first peripheral interlayer insulating layer 290 and the cell interlayer insulating layer 295 may be formed at the same level. For example, each of an upper surface of the first peripheral interlayer insulating layer 290, an upper surface of the cell interlayer insulating layer 295, and the uppermost surface of the second etching stop layer 250 may be formed on the same plane. However, the present disclosure is not limited thereto. The first peripheral interlayer insulating layer 290 and the cell interlayer insulating layer 295 may include the same material. The first peripheral interlayer insulating layer 290 and the cell interlayer insulating layer 295 may include, for example, an oxide-based insulating material.

In some embodiments, and as seen in FIG. 10, the peripheral gate structure 240ST may include a first peripheral gate structure and a second peripheral gate structure.

The first peripheral gate structure and second peripheral gate structure may be between adjacent peripheral element separation layers 26. The first peripheral gate structure may be spaced apart from the second peripheral gate structure. In addition, the peripheral gate structure 240ST may include a third peripheral gate structure spaced apart from the first peripheral gate structure with the peripheral element separation layer 26 interposed therebetween. Each of the first to third peripheral gate structures may include a peripheral gate insulating layer 230, a peripheral gate conductive layer 240, a peripheral capping layer 244, and a peripheral spacer 245.

An insertion interlayer insulating layer 291 may be on the bit line gate structure 140ST, the peripheral gate structure 240ST, the first block gate structure 240ST_1, the second block gate structure 240ST_2, the second etching stop layer 250, the first peripheral interlayer insulating layer 290, and the cell interlayer insulating layer 295. The insertion interlayer insulating layer 291 may cover the bit line gate structure 140ST, the peripheral gate structure 240ST, the first block gate structure 240ST_1, the second block gate structure 240ST_2, the second etching stop layer 250, the first peripheral interlayer insulating layer 290, and the cell interlayer insulating layer 295.

The insertion interlayer insulating layer 291 may include a material different from that of the first peripheral interlayer insulating layer 290 and the cell interlayer insulating layer 295. The insertion interlayer insulating layer 291 may include, for example, a nitride-based insulating material. For example, the insertion interlayer insulating layer 291 may include silicon nitride.

In FIGS. 6 and 7, a first contact CB1 may be on the bit line gate structure 140ST. The first contact CB1 may extend through the insertion interlayer insulating layer 291 and the second etching stop layer 250 in a vertical direction D4, and may be connected to the bit line gate structure 140ST. Here, the vertical direction D4 may be defined as a direction perpendicular to each of the first to third horizontal directions D1, D2, and D3. An upper surface of the first contact CB1 may be formed on the same plane as an upper surface of the insertion interlayer insulating layer 291, but the present disclosure is not limited thereto.

The first contact CB1 may extend through the cell line capping layer 144 in the vertical direction D4 and extend into the third cell conductive layer 143. The first contact CB1 may be in contact with the second cell conductive layer 142. For example, the first contact CB1 may be in contact with an uppermost surface of the second cell conductive layer 142. The first contact CB1 may not extend into the first cell conductive layer 141. That is, the first contact CB1 may not be in contact with the first cell conductive layer 141, or the first contact CB1 may be separated from or spaced apart from the first cell conductive layer 141.

The first contact CB1 may include a first portion CB1_1 that is arranged in or inside the third cell conductive layer 143, and a second portion CB1_2 that is arranged in or inside the cell line capping layer 144. The first portion CB1_1 of the first contact CB1 may be in contact with the uppermost surface of the second cell conductive layer 142. The second portion CB1_2 of the first contact CB1 may be connected to the first portion CB1_1 of the first contact CB1.

A sidewall of the first portion CB1_1 of the first contact CB1 may protrude convexly in the second horizontal direction D2. Specifically, both sidewalls of the first portion CB1_1 of the first contact CB1 may protrude convexly in a side direction from a central portion of the first portion CB1_1 of the first contact CB1.

For example, a width W1 of the first portion CB1_1 of the first contact CB1 in the second horizontal direction D2 may be greater than a width W2 of the second portion CB1_2 of the first contact CB1 in the second horizontal direction D2. Here, the width W2 of the second portion CB1_2 of the first contact CB1 in the second horizontal direction D2 may be defined as a width at a boundary line between the first portion CB1_1 of the first contact CB1 and the second portion CB1_2 of the first contact CB1. In some embodiments, the width W1 of the first portion CB1_1 of the first contact CB1 in the second horizontal direction D2 may be a maximum width of the first portion CB1_1 of the first contact CB1 in the second horizontal direction D2.

The first contact CB1 may include a first barrier layer CB1a and a first filling layer CB1b. The first barrier layer CB1a may form sidewalls and a bottom surface of the first contact CB1. That is, the first barrier layer CB1a may be in contact with the uppermost surface of the second cell conductive layer 142. The first barrier layer CB1a may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), and/or rhodium (Rh). However, the present disclosure is not limited thereto.

The first filling layer CB1b may be on the first barrier layer CB1a. The first filling layer CB1b may include, for example, at least one of aluminum (Al), copper (Cu), tungsten (W), cobalt (Co), ruthenium (Ru), and/or molybdenum (Mo). However, the present disclosure is not limited thereto.

In FIGS. 8 and 9, a second contact CB2 may be on the cell gate structure 110. The second contact CB2 may extend through the insertion interlayer insulating layer 291, the cell interlayer insulating layer 295, the second etching stop layer 250, and the cell insulating layer 130 in the vertical direction D4, and may be connected to the cell gate structure 110. An upper surface of the second contact CB2 may be formed on the same plane as the upper surface of the insertion interlayer insulating layer 291, but the present disclosure is not limited thereto.

The second contact CB2 may extend through the cell gate capping layer 113 in the vertical direction D4 and may extend into the cell gate electrode 112. The second contact CB2 may include a first portion CB2_1 arranged in or inside the cell gate electrode 112, and a second portion CB2_2 arranged in or inside the cell gate capping layer 113. The second portion CB2_2 of the second contact CB2 may be connected to the first portion CB2_1 of the second contact CB2.

A sidewall of the first portion CB2_1 of the second contact CB2 may protrude convexly in the first horizontal direction D1. Specifically, both sidewalls of the second portion CB2_1 of the second contact CB2 may protrude convexly in a side direction from a central portion of the first portion CB2_1 of the second contact CB2.

For example, a width W3 of the first portion CB2_1 of the second contact CB2 in the first horizontal direction D1 may be greater than a width W4 of the second portion CB2_2 of the second contact CB2 in the first horizontal direction D1. Here, the width W4 of the second portion CB2_2 of the second contact CB2 in the first horizontal direction D1 may be defined as a width at a boundary line between the first portion CB2_1 of the second contact CB2 and the second portion CB2_2 of the second contact CB2. In some embodiments, the width W3 of the first portion CB2_1 of the second contact CB2 in the first horizontal direction D1 may be a maximum width of the first portion CB2_1 of the second contact CB2 in the first horizontal direction D1.

The second contact CB2 may include a second barrier layer CB2a and a second filling layer CB2b. The second barrier layer CB2a may form sidewalls and a bottom surface of the second contact CB2. For example, the second barrier layer CB2a may include the same material as the first barrier layer CB1a. The second filling layer CB2b may be on the second barrier layer CB2a. For example, the second filling layer CB2b may include the same material as the first filling layer CB1b.

In FIGS. 10 and 11, a third contact CB3 may be on the peripheral gate structure 240ST. The third contact CB3 may extend through the insertion interlayer insulating layer 291 and the second etching stop layer 250 in the vertical direction D4, and may be connected to the peripheral gate structure 240ST. An upper surface of the third contact CB3 may be formed on the same plane as the upper surface of the insertion interlayer insulating layer 291, but the present disclosure is not limited thereto.

The third contact CB3 may extend through the peripheral capping layer 244 in the vertical direction D4 and may extend into the third peripheral conductive layer 243. The third contact CB3 may be in contact with the second peripheral conductive layer 242. For example, the third contact CB3 may be in contact with an upper surface of the second peripheral conductive layer 242. The third contact CB3 may not extend into the first peripheral conductive layer 241. That is, the third contact CB3 may not be in contact with the first peripheral conductive layer 241, or the third contact CB3 may be separated from or spaced apart from the first peripheral conductive layer 241.

For example, the third contact CB3 may include a first portion CB3_1 that is arranged in or inside the third peripheral conductive layer 243, and a second portion CB3_2 that is arranged in or inside the peripheral capping layer 244. The first portion CB3_1 of the third contact CB3 may be in contact with the upper surface of the second peripheral conductive layer 242. The second portion CB3_2 of the third contact CB3 may be connected to the first portion CB3_1 of the third contact CB3.

For example, a sidewall of the first portion CB3_1 of the third contact CB3 may protrude convexly in the first horizontal direction D1. Specifically, both sidewalls of the first portion CB3_1 of the third contact CB3 may protrude convexly in a side direction from a central portion of the first portion CB3_1 of the third contact CB3.

For example, a width W5 of the first portion CB3_1 of the third contact CB3 in the first horizontal direction D1 may be greater than a width W6 of the second portion CB3_2 of the third contact CB3 in the first horizontal direction D1. Here, the width W6 of the second portion CB3_2 of the third contact CB3 in the first horizontal direction D1 may be defined as a width at a boundary line between the first portion CB3_1 of the third contact CB3 and the second portion CB3_2 of the third contact CB3. In some embodiments, the width W5 of the first portion CB3_1 of the third contact CB3 in the first horizontal direction D1 may be a maximum width of the first portion CB3_1 of the third contact CB3 in the first horizontal direction D1.

The third contact CB3 may include a third barrier layer CB3a and a third filling layer CB3b. The third barrier layer CB3a may form sidewalls and a bottom surface of the third contact CB3. For example, the third barrier layer CB3a may include the same material as the first barrier layer CB1a. The third filling layer CB3b may be on the third barrier layer CB3a. For example, the third filling layer CB3b may include the same material as the first filling layer CB1b.

Each of a peripheral wiring line 260, a bit line contact plug 261, a cell gate contact plug 262, and a peripheral contact plug 265 may be on the insertion interlayer insulating layer 291. Each of the peripheral wiring line 260, the bit line contact plug 261, the cell gate contact plug 262, and the peripheral contact plug 265 may be at the same level. The bit line contact plug 261 may be connected to the first contact CB1. The cell gate contact plug 262 may be connected to the second contact CB2. The peripheral contact plug 265 may be connected to the third contact CB3.

For example, the bit line contact plug 261 may include the same material as the first contact CB1, the cell gate contact plug 262 may include the same material as the second contact CB2, and the peripheral contact plug 265 may include the same material as the third contact CB3. However, the present disclosure is not limited thereto. For example, each of the peripheral wiring line 260, the bit line contact plug 261, the cell gate contact plug 262, and the peripheral contact plug 265 may include the same material as the storage pad 160.

For example, a peripheral wiring separation pattern 280 may separate the bit line contact plug 261 and the peripheral contact plug 265 from each other. The peripheral wiring separation pattern 280 may separate the cell gate contact plug 262 and the peripheral contact plug 265 from each other. The peripheral wiring separation pattern 280 may separate the peripheral wiring line 260 and the peripheral contact plug 265 from each other. The peripheral wiring separation pattern 280 may include, for example, at least one of a silicon oxide film, a silicon nitride film, a silicon oxynitride film, a silicon oxycarbonitride film, and a silicon carbonitride film.

The first etching stop layer 292 may be on the peripheral wiring line 260, the bit line contact plug 261, the cell gate contact plug 262, the peripheral contact plug 265, and the peripheral wiring separation pattern 280. A second peripheral interlayer insulating layer 293 may be on the first etching stop layer 292. The second peripheral interlayer insulating layer 293 may cover a sidewall of the first upper electrode 193. The second peripheral interlayer insulating layer 293 may include an insulating material.

In the semiconductor memory device according to some exemplary embodiments of the present disclosure, reliability of the semiconductor memory device may be improved by increasing a contact area between the contact CB1 connected to the bit line gate structure 140ST and the bit line gate structure 140ST. Further, in the semiconductor memory device according to some exemplary embodiments of the present disclosure, reliability of the semiconductor memory device may be improved by increasing a contact area between the contact CB3 connected to the peripheral gate structure 240ST and the peripheral gate structure 240ST.

Hereinafter, a method of manufacturing a semiconductor memory device according to some exemplary embodiments of the present disclosure will be described with reference to FIGS. 1 to 25.

FIGS. 12 to 25 are intermediate step views for describing a method of manufacturing a semiconductor memory device according to some exemplary embodiments of the present disclosure.

Figure 12:
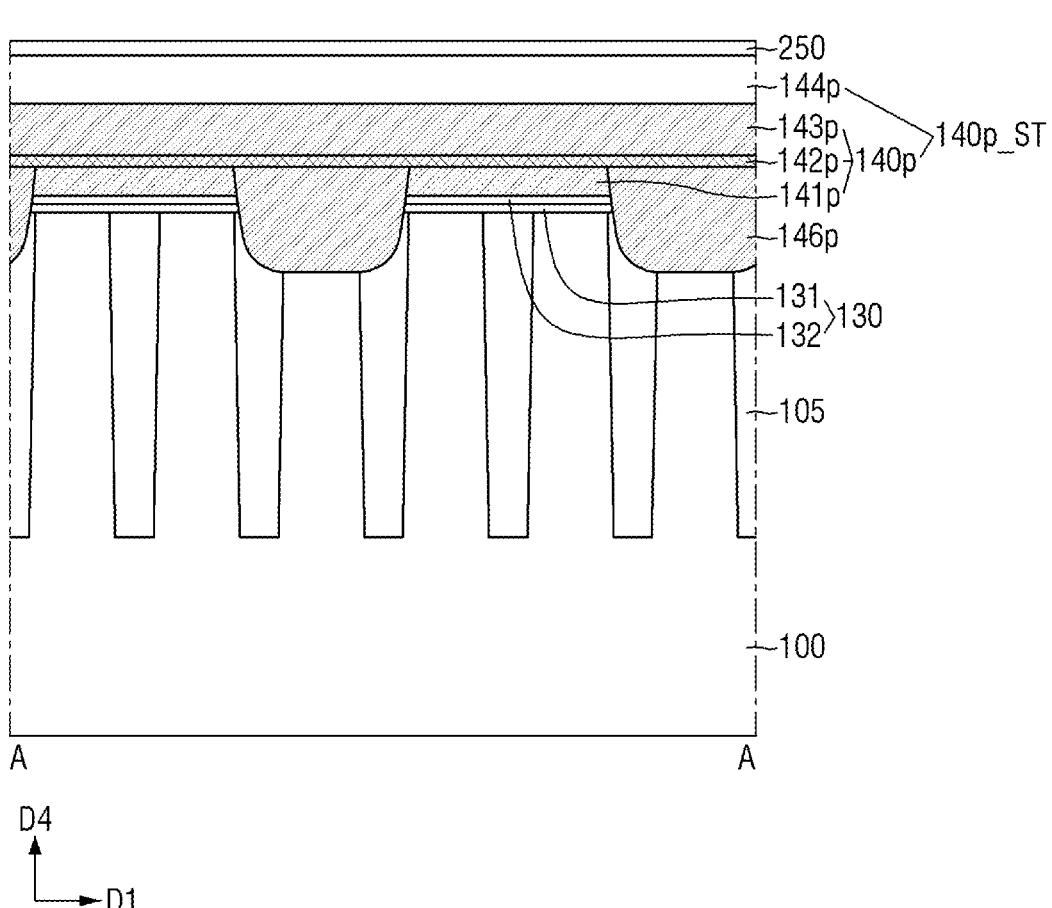
Figure 13:
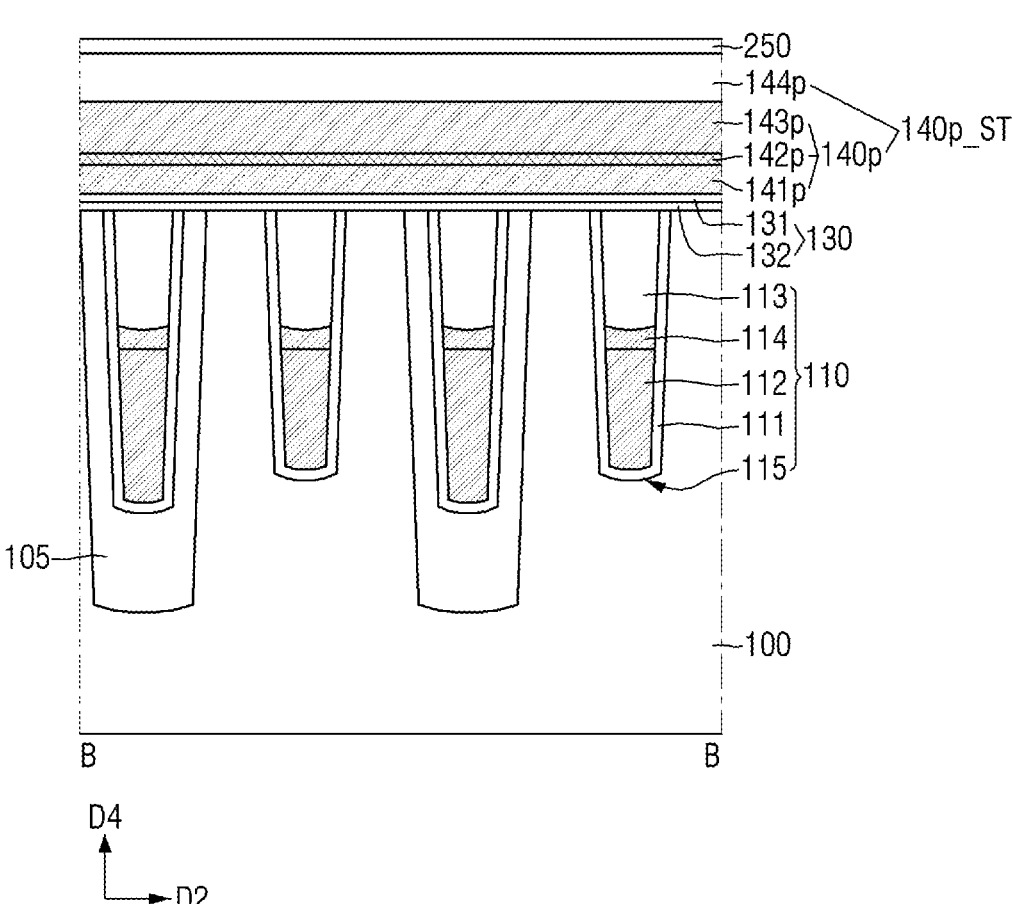
Figure 14:
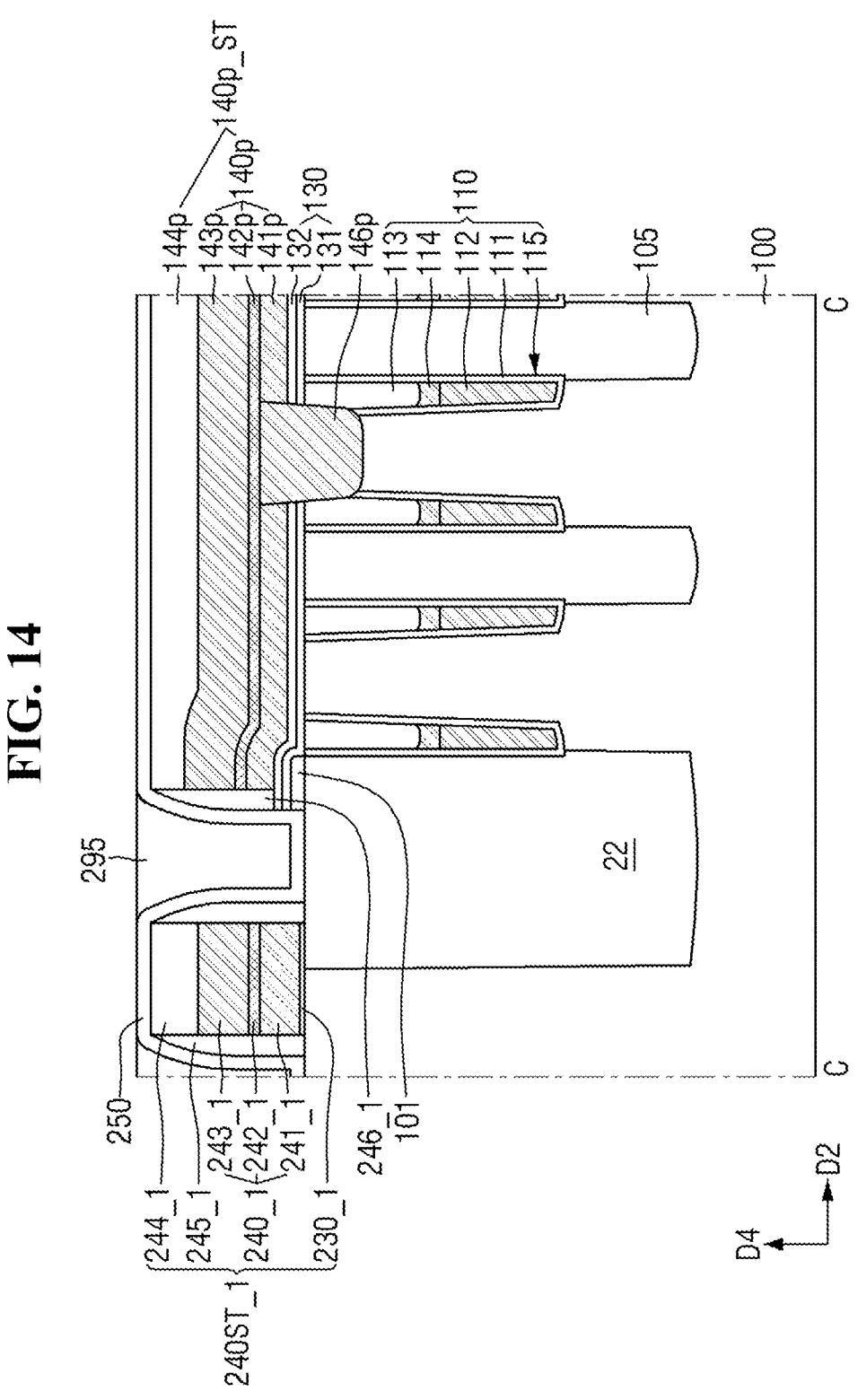
Figure 15:
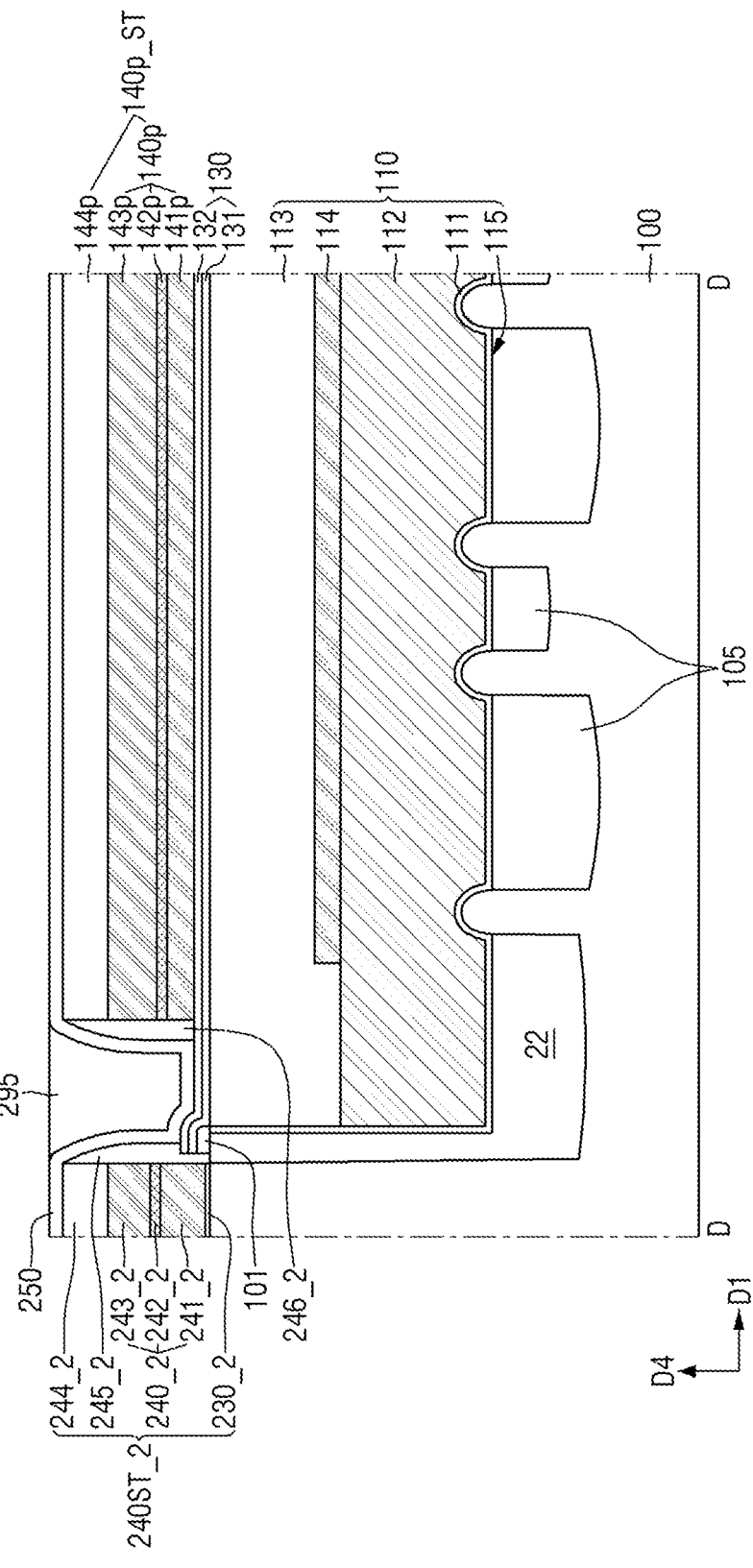
Figure 16:
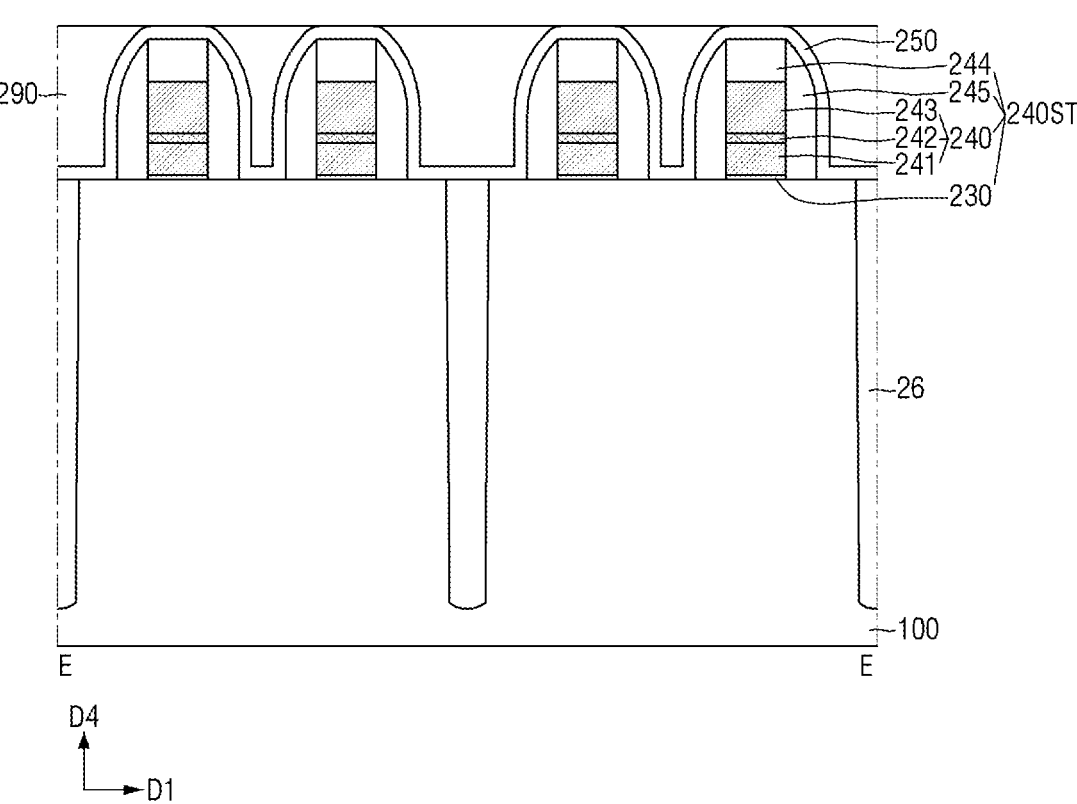

FIGS. 12 and 13 are cross-sectional views taken along lines A-A and B-B, respectively, of FIG. 1. FIGS. 14 to 16 are cross-sectional views taken along lines C-C, D-D, and E-E, respectively, of FIG. 2. Referring to FIGS. 1, 2, and 12 to 16, a substrate 100 including a cell region 20, a peripheral region 24, and a cell region separation layer 22 may be provided.

A cell gate structure 110 may be formed in the substrate 100 of the cell region 20. The cell gate structure 110 may extend in length in a first horizontal direction D1. The cell gate structure 110 may include a cell gate trench 115, a cell gate insulating layer 111, a cell gate electrode 112, a cell gate capping layer 113, and a cell gate capping conductive layer 114.

Subsequently, a cell insulating layer 130 may be formed on the cell region 20. The cell insulating layer 130 may expose the substrate 100 of the peripheral region 24. Subsequently, a cell conductive layer structure 140*p*_ST may be formed on the substrate 100 of the cell region 20. The cell conductive layer structure 140*p*_ST may be formed on the cell insulating layer 130. In addition, a pre-bit line contact 146*p* may be formed between the cell conductive layer structure 140*p*_ST and the substrate 100. The pre-bit line contact 146*p* may connect the cell conductive layer structure 140*p*_ST and the substrate 100 to each other.

The cell conductive layer structure 140*p*_ST may include a pre-cell conductive layer 140*p* and a lower cell capping layer 144*p* that are sequentially stacked on the cell insulating layer 130. The pre-cell conductive layer 140*p* may include a first pre-cell conductive layer 141*p*, a second pre-cell conductive layer 142*p*, and a third pre-cell conductive layer 143*p* that are sequentially stacked on the cell insulating layer 130. A first cell boundary spacer 246_1 and a second cell boundary spacer 246_2 may be formed on a sidewall of the cell conductive layer structure 140*p*_ST.

A peripheral gate structure 240ST may be formed on the substrate 100 of the peripheral region 24. The peripheral gate structure 240ST may include a peripheral gate insulating layer 230, a peripheral gate conductive layer 240, a peripheral capping layer 244, and a peripheral spacer 245. In addition, a first block gate structure 240ST_1 and a second block gate structure 240ST_2 may be formed on the substrate 100.

The cell conductive layer structure 140*p*_ST may be formed simultaneously with the peripheral gate structure 240ST. Specifically, the cell conductive layer structure 140*p*_ST may be formed simultaneously with the peripheral gate insulating layer 230, the peripheral gate conductive layer 240, and the peripheral capping layer 244. The first cell boundary spacer 246_1 and the second cell boundary spacer 246_2 may be formed simultaneously with the peripheral spacer 245.

Subsequently, a second etching stop layer 250 may be formed on the substrate 100. The second etching stop layer 250 may be formed on the cell conductive layer structure 140*p*_ST, the peripheral gate structure 240ST, the first block gate structure 240ST_1, and the second block gate structure 240ST_2. The second etching stop layer 250 may extend along each of a profile of the cell conductive layer structure 140*p*_ST, a profile of the peripheral gate structure 240ST, a profile of the first block gate structure 240ST_1, and a profile of the second block gate structure 240ST_2.

Subsequently, a cell interlayer insulating layer 295 and a first peripheral interlayer insulating layer 290 may be formed on the second etching stop layer 250. For example, each of an upper surface of the cell interlayer insulating layer 295 and an upper surface of the first peripheral interlayer insulating layer 290 may be formed on or in the same plane as the uppermost surface of the second etching stop layer 250. However, the present disclosure is not limited thereto.

Figure 17:
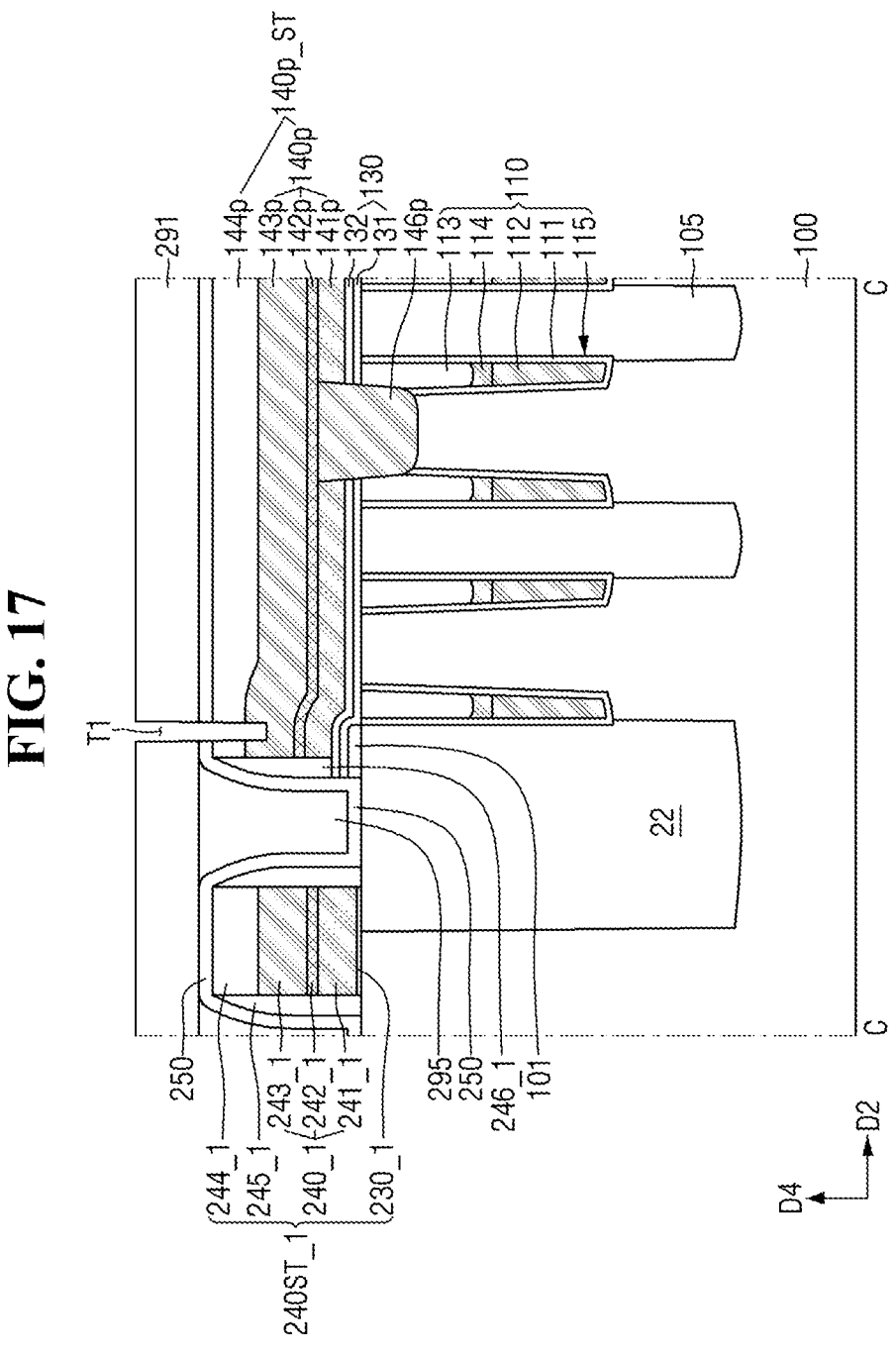
Figure 18:
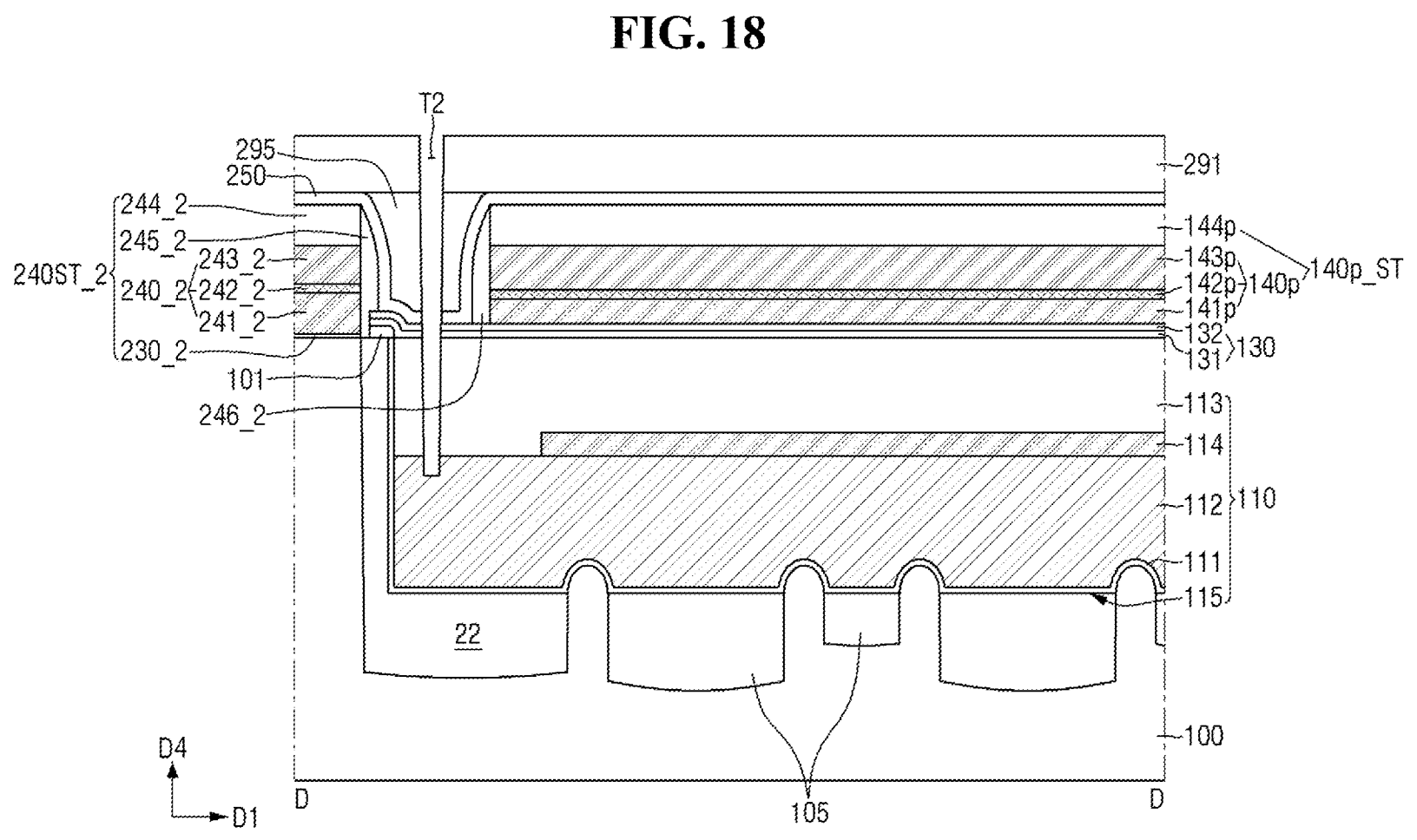
Figure 19:
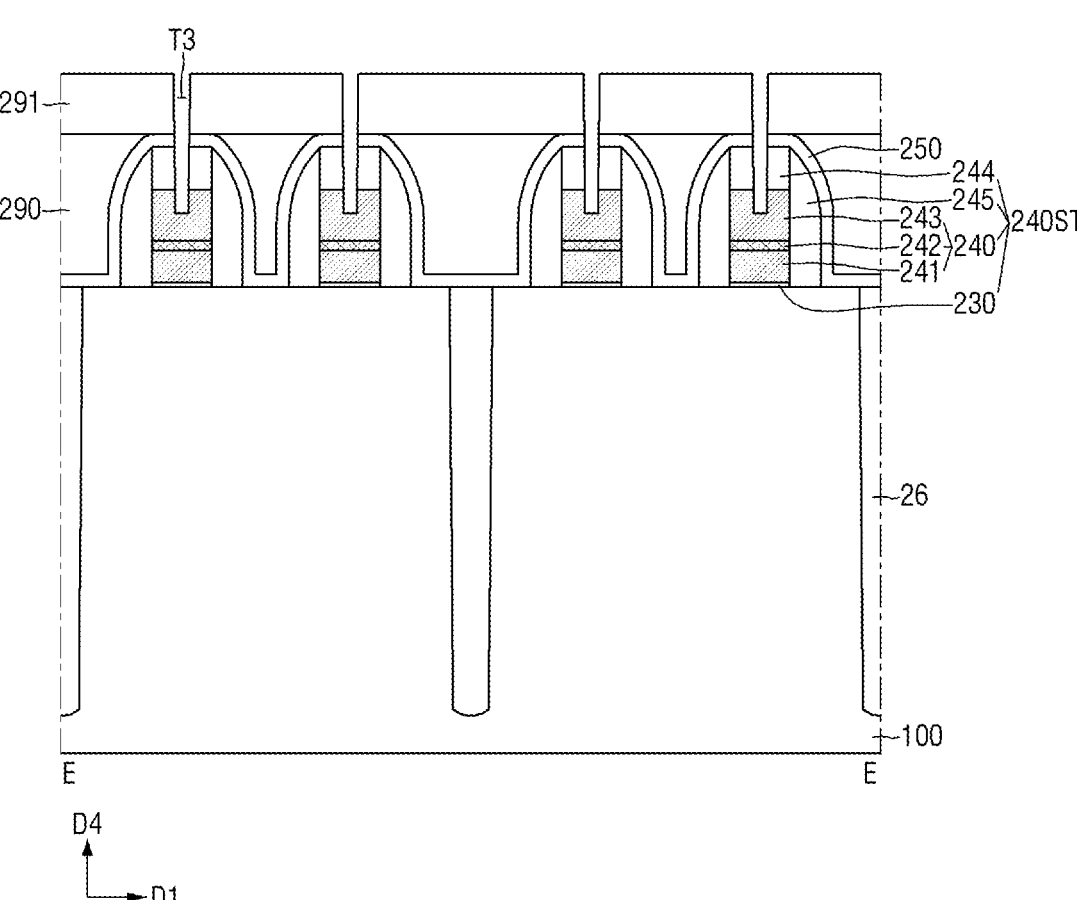

FIGS. 17 to 19 are cross-sectional views taken along lines C-C, D-D, and E-E, respectively, of FIG. 2. Referring to FIGS. 17 to 19, an insertion interlayer insulating layer 291 may be formed on the cell interlayer insulating layer 295 and the first peripheral interlayer insulating layer 290.

Subsequently, a first trench T1 extending through the insertion interlayer insulating layer 291, the second etching stop layer 250, and the lower cell capping layer 144*p* in the vertical direction D4 and extending into the third pre-cell conductive layer 143*p* may be formed. For example, a bottom surface of the first trench T1 may be formed inside the third pre-cell conductive layer 143*p*.

In addition, a second trench T2 extending through the insertion interlayer insulating layer 291, the cell interlayer insulating layer 295, the second etching stop layer 250, the cell insulating layer 130, and the cell gate capping layer 113 in the vertical direction D4 and extending into the cell gate electrode 112 may be formed. For example, a bottom surface of the second trench T2 may be formed inside the cell gate electrode 112.

In addition, a third trench T3 extending through the insertion interlayer insulating layer 291, the second etching stop layer 250, and the peripheral capping layer 244 in the vertical direction D4 and extending into the third peripheral conductive layer 243 may be formed. For example, a bottom surface of the third trench T3 may be formed inside the third peripheral conductive layer 243.

Figure 20:
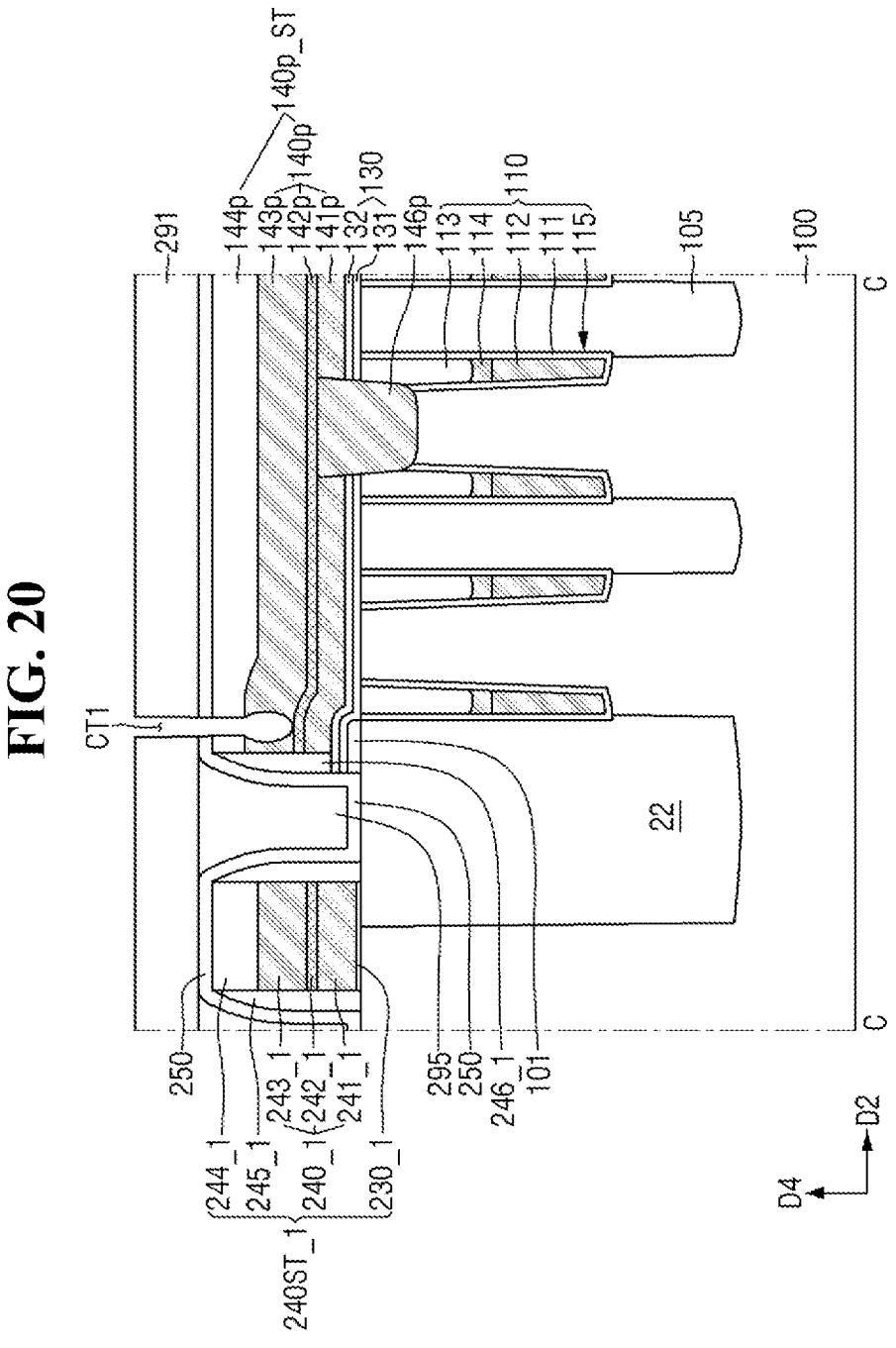
Figure 21:
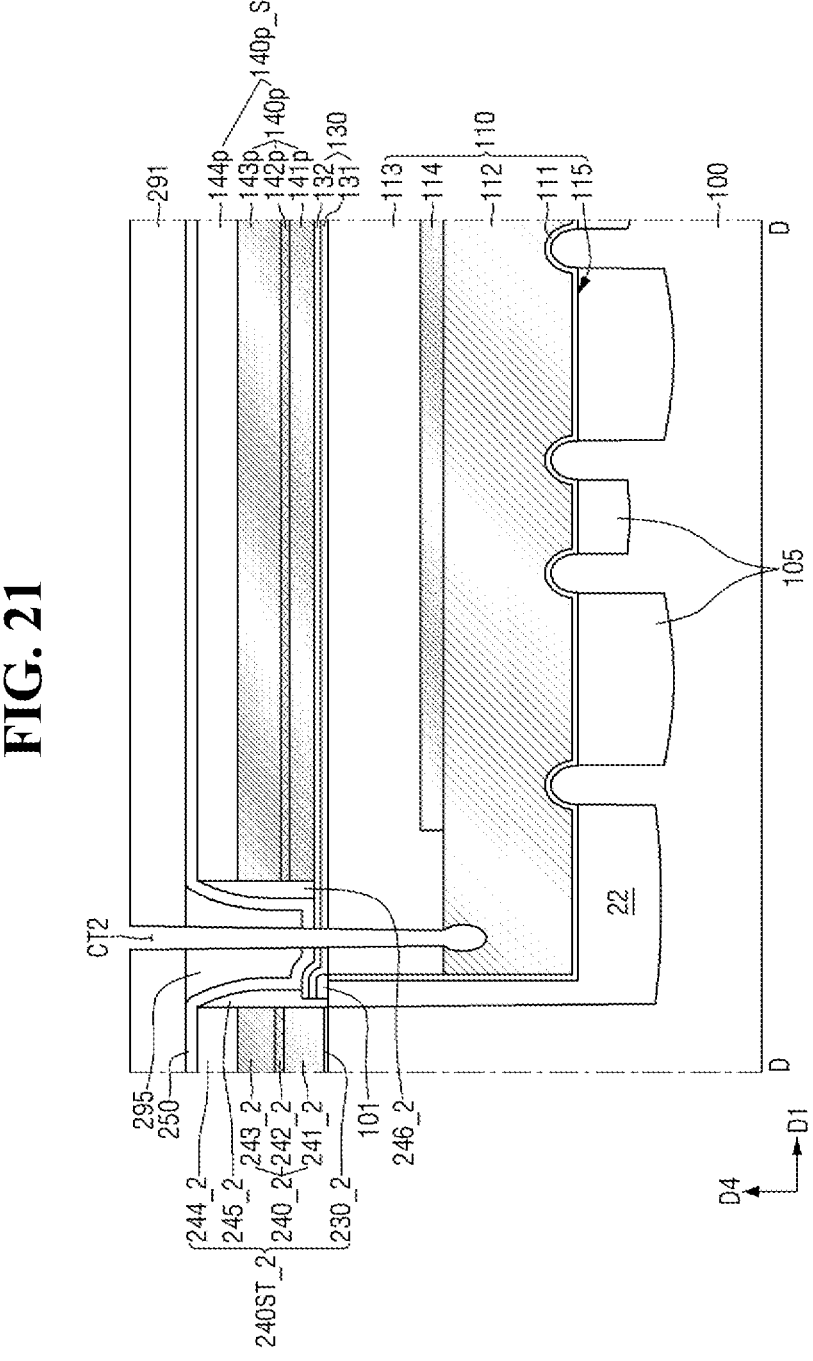
Figure 22:
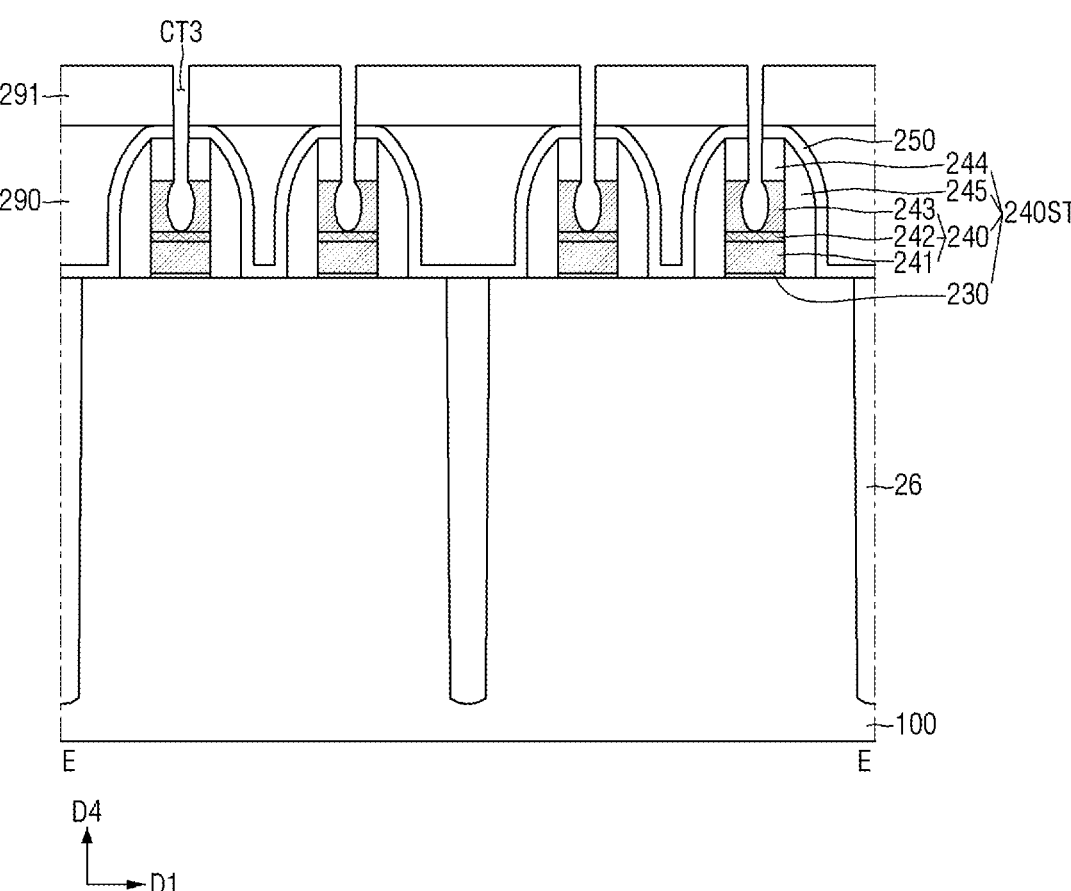

FIGS. 20 to 22 are cross-sectional views taken along lines C-C, D-D, and E-E, respectively, of FIG. 2. Referring to FIGS. 20 to 22, an additional etching process may be performed inside each of the first to third trenches T1, T2, and T3. For example, the additional etching process may be a wet etching process.

Through the additional etching process, a portion of the third pre-cell conductive layer 143*p* exposed by the first trench T1 may be etched to form a first contact trench CT1. A width of the first contact trench CT1 in the third pre-cell conductive layer 143*p* in the second horizontal direction D2 may be greater than a width of the first contact trench CT1 in the lower cell capping layer 144*p* in the second horizontal direction D2. The uppermost surface of the second pre-cell conductive layer 142*p* may be exposed by the first contact trench CT1.

In addition, through the additional etching process, a portion of the cell gate electrode 112 exposed by the second trench T2 may be etched to form a second contact trench CT2. A width of the second contact trench CT2 in the cell gate electrode 112 in the first horizontal direction D1 may be greater than a width of the second contact trench CT2 in the cell gate capping layer 113 in the first horizontal direction D1.

In addition, through the additional etching process, a portion of the third peripheral conductive layer 243 exposed by the third trench T3 may be etched to form a third contact trench CT3. A width of the third contact trench CT3 in the third peripheral conductive layer 243 in the first horizontal direction D1 may be greater than a width of the third contact trench CT3 in the peripheral capping layer 244 in the first horizontal direction D1. The uppermost surface of the second peripheral conductive layer 242 may be exposed by the third contact trench CT3.

Figure 23:
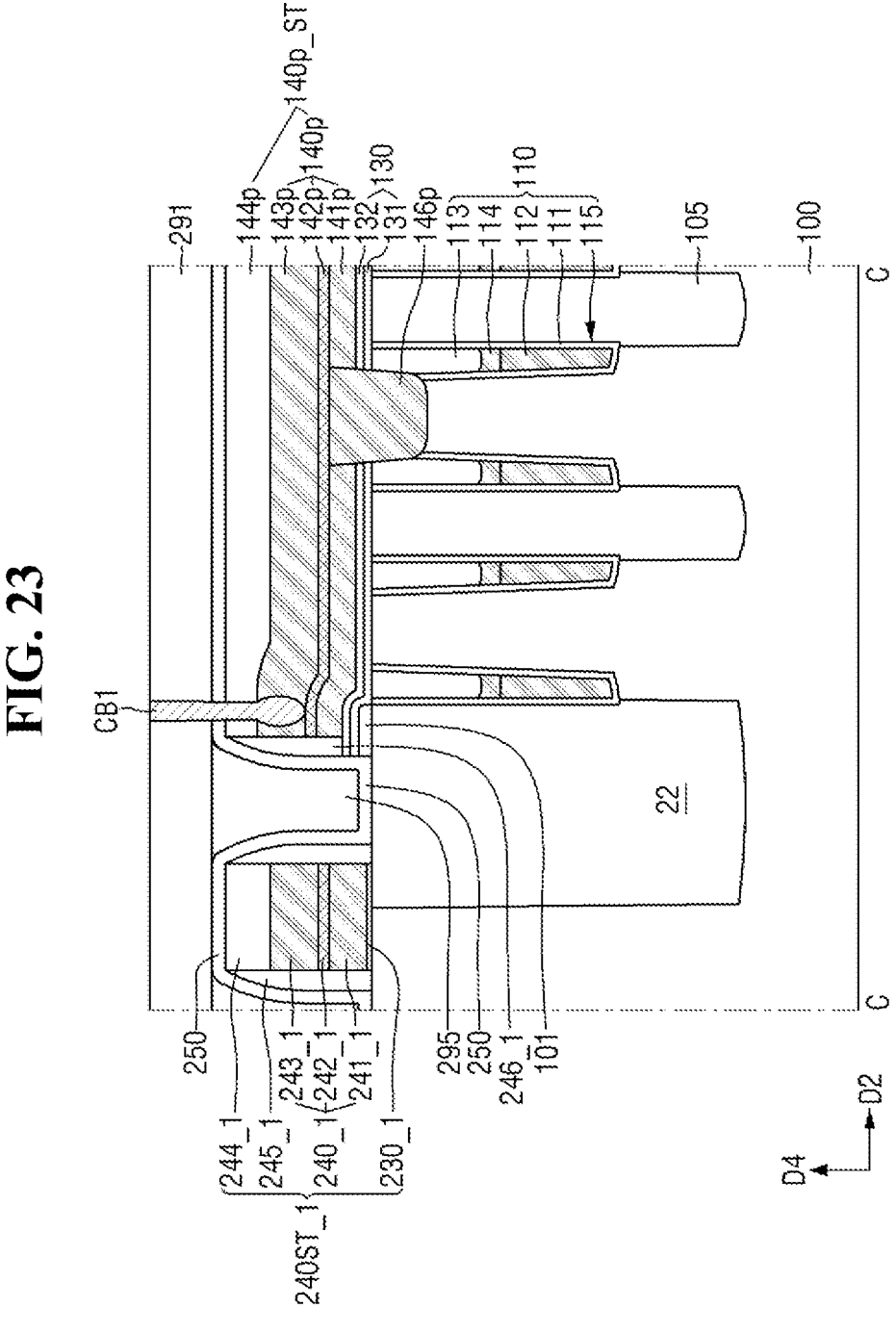
Figure 24:
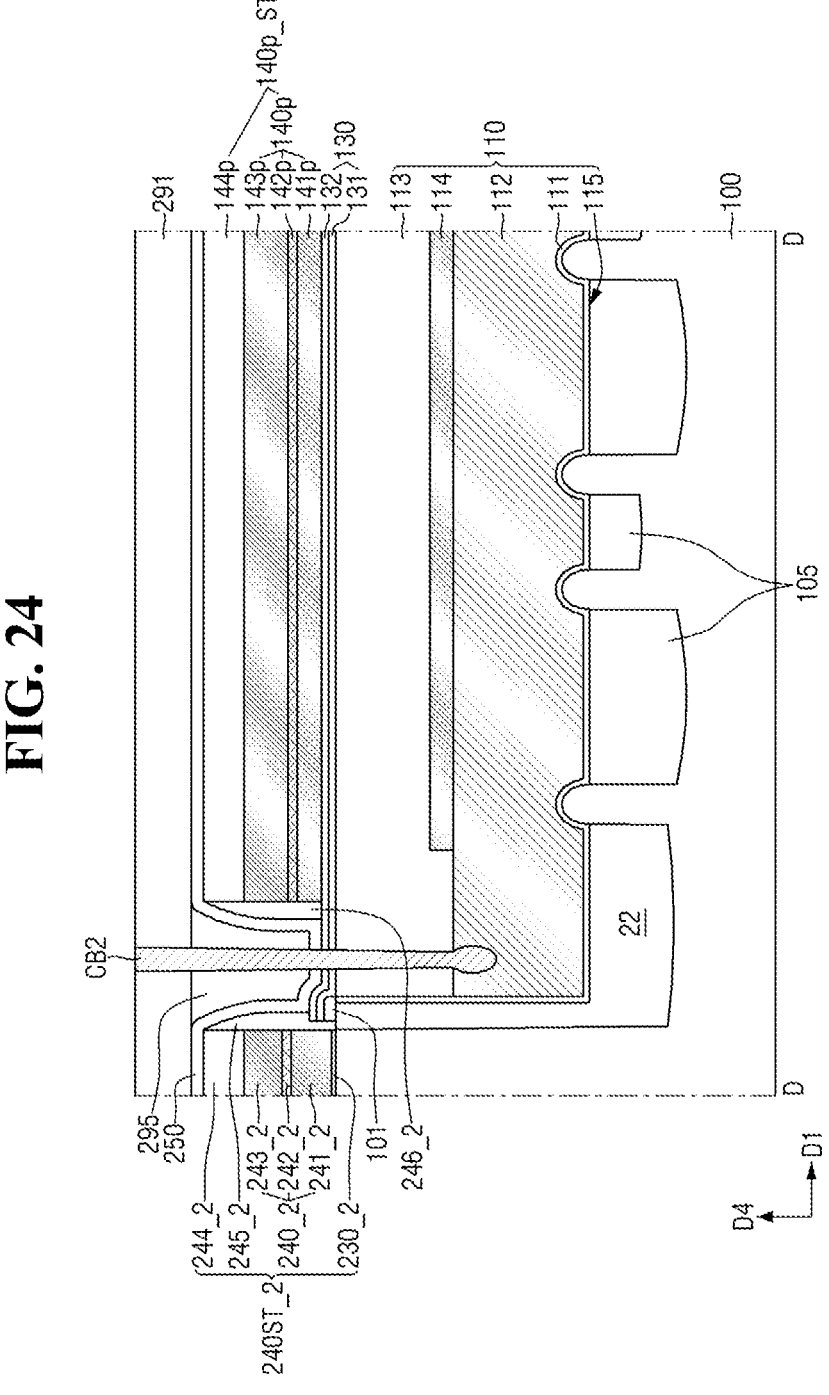
Figure 25:
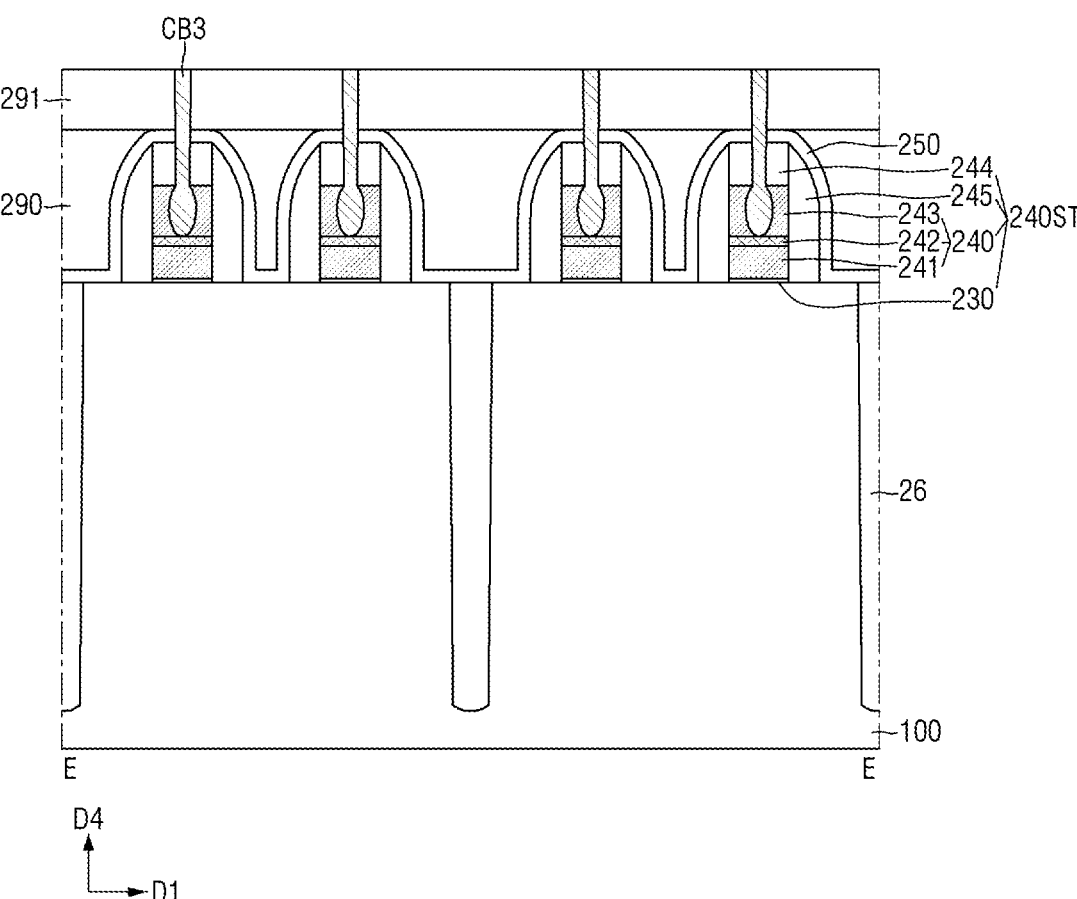

FIGS. 23 to 25 are cross-sectional views taken along lines C-C, D-D, and E-E, respectively, of FIG. 2. Referring to FIGS. 23 to 25, a first contact CB1 may be formed in the first contact trench CT1, a second contact CB2 may be formed in the second contact trench CT2, and a third contact CB3 may be formed in the third contact trench CT3.

Referring to FIGS. 1 to 11, an insertion interlayer insulating layer 291 may be formed on the first peripheral interlayer insulating layer 290 and the cell interlayer insulating layer 295. The insertion interlayer insulating layer 291 may be formed on the cell region 20 as well as the peripheral region 24.

Subsequently, a bit line gate structure 140ST extending in length in the second horizontal direction D2 may be formed by patterning the cell conductive layer structure 140*p*_ST, the insertion interlayer insulating layer 291 on the cell region, and the second etching stop layer 250. While the bit line gate structure 140ST is formed, a bit line contact 146 may be formed.

Subsequently, a cell line spacer 150 may be formed. The fourth cell line spacer 154 of the cell line spacer 150 may also be formed on the upper surface of the bit line gate structure 140ST and the insertion interlayer insulating layer 291 of the peripheral region 24.

Subsequently, a fence pattern 170 may be formed between the bit line gate structures 140ST adjacent in the first horizontal direction D1. Subsequently, a storage contact 120 may be formed between the adjacent cell conductive lines 140 and between the fence patterns 170 adjacent in the second horizontal direction D2.

Subsequently, a storage pad 160, a peripheral wiring line 260, a bit line contact plug 261, a cell gate contact plug 262, and a peripheral contact plug 265 may be formed. Subsequently, the first etching stop layer 292 and an information storage portion 190 may be formed. Through the manufacturing process as described above, the semiconductor memory device illustrated in FIGS. 1 to 11 may be manufactured.

Hereinafter, a semiconductor memory device according to some other exemplary embodiments of the present disclosure will be described with reference to FIGS. 26 to 28. Differences from the semiconductor memory device illustrated in FIGS. 1 to 11 will be mainly described in the interest of brevity.

Figure 26:
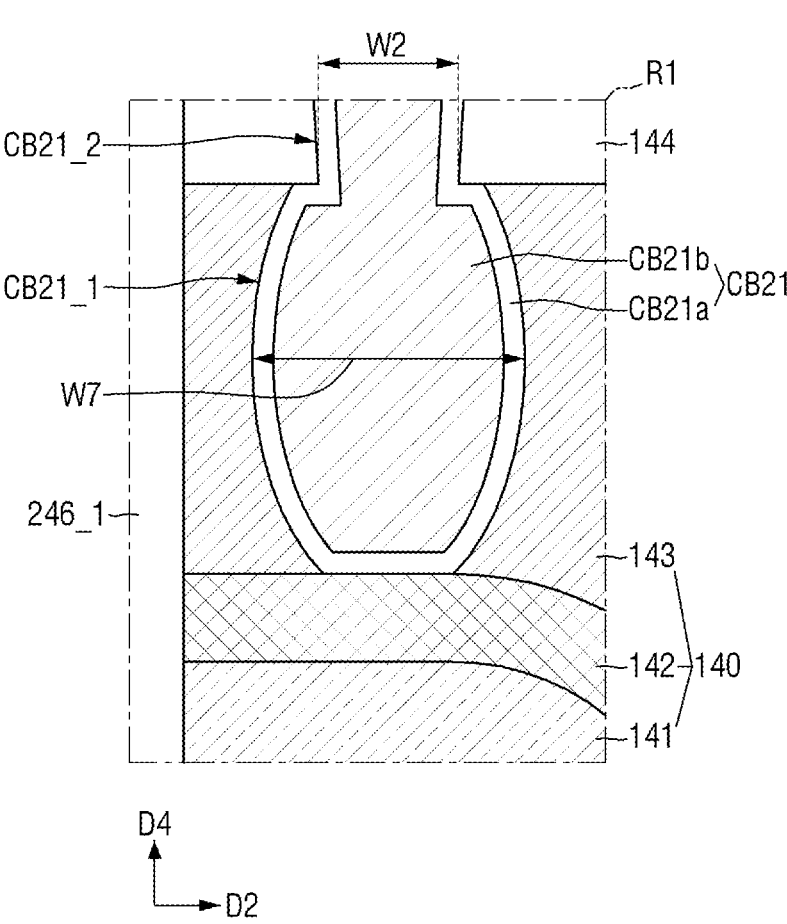
FIGS. 26 to 28 are enlarged views for describing a semiconductor memory device according to some exemplary embodiments of the present disclosure.
Figure 27:
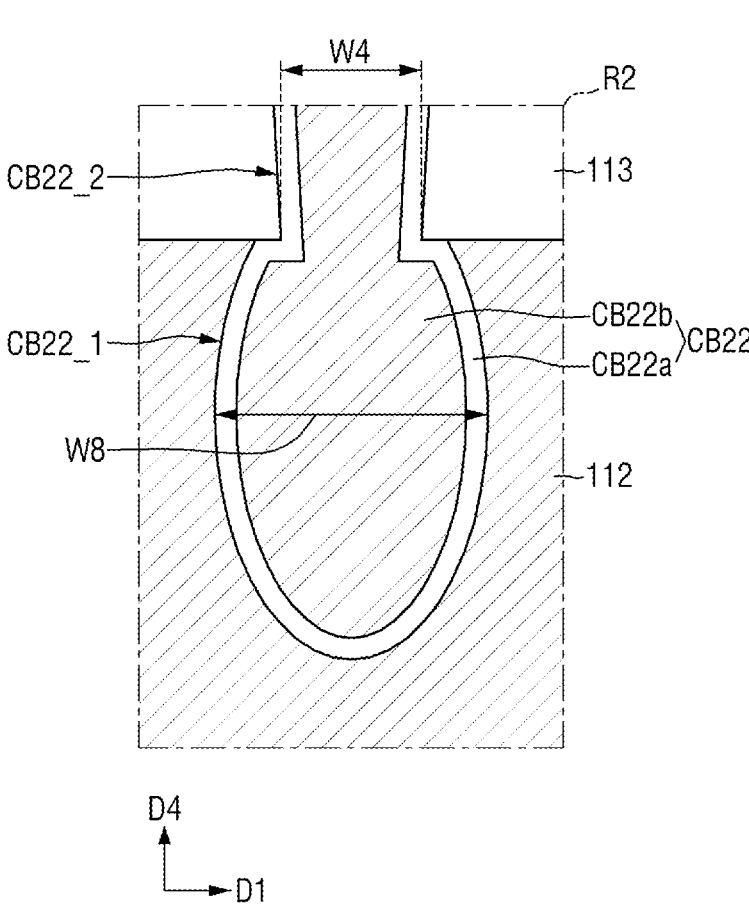
Figure 28:
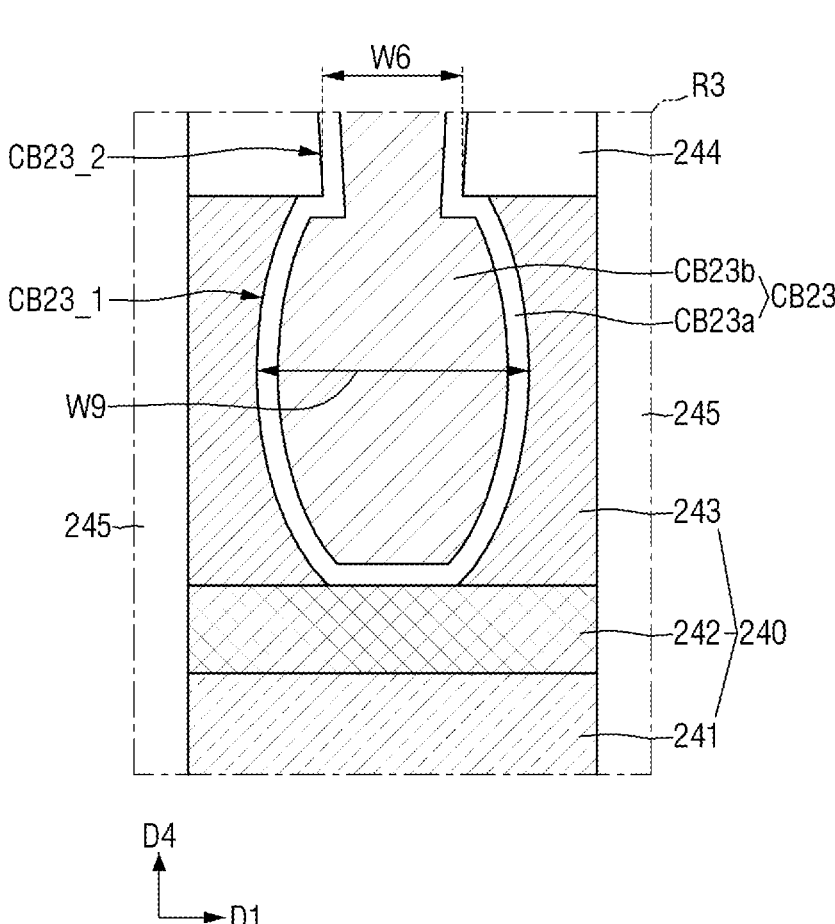

FIGS. 26 to 28 are enlarged views for describing a semiconductor memory device according to some exemplary embodiments of the present disclosure. FIG. 26 is an enlarged view of region R1 of FIG. 6; FIG. 27 is an enlarged view of region R2 of FIG. 8; and FIG. 28 is an enlarged view of region R3 of FIG. 10.

Referring to FIGS. 26 to 28, in a semiconductor memory device according to some exemplary embodiments of the present disclosure, at least a portion of an upper surface of a first portion CB21_1 of a first contact CB21 may be in contact with the cell line capping layer 144. At least a portion of an upper surface of a first portion CB22_1 of a second contact CB22 may be in contact with the cell gate capping layer 113. At least a portion of an upper surface of a first portion CB23_1 of a third contact CB23 may be in contact with the peripheral capping layer 244.

For example, a width W7 of the first portion CB21_1 of the first contact CB21 in the second horizontal direction D2 may be greater than a width W2 of a second portion CB21_2 of the first contact CB21 in the second horizontal direction D2. The first contact CB21 may include a first barrier layer CB21*a* and a first filling layer CB21*b* on the first barrier layer CB21*a*. In some embodiments, the width W7 of the first portion CB21_1 of the first contact CB21 in the second horizontal direction D2 may be a maximum width of the first portion CB21_1 of the first contact CB21 in the second horizontal direction D2.

For example, a width W8 of the first portion CB22_1 of the second contact CB22 in the first horizontal direction D1 may be greater than a width W4 of a second portion CB22_2 of the second contact CB22 in the first horizontal direction D1. The second contact CB22 may include a second barrier layer CB22*a* and a second filling layer CB22*b* on the second barrier layer CB22*a*. In some embodiments, the width W8 of the first portion CB22_1 of the second contact CB22 in the first horizontal direction D1 may be a maximum width of the first portion CB22_1 of the second contact CB22 in the first horizontal direction D1.

For example, a width W9 of the first portion CB23_1 of the third contact CB23 in the first horizontal direction D1 may be greater than a width W6 of a second portion CB23_2 of the third contact CB23 in the first horizontal direction D1. The third contact CB23 may include a third barrier layer CB23*a* and a third filling layer CB23*b* on the third barrier layer CB23*a*. In some embodiments, the width W9 of the first portion CB23_1 of the third contact CB23 in the first horizontal direction D1 may be a maximum width of the first portion CB23_1 of the third contact CB23 in the first horizontal direction D1.

Hereinafter, a semiconductor memory device according to some exemplary embodiments of the present disclosure will be described with reference to FIGS. 29 to 31. Differences from the semiconductor memory device illustrated in FIGS. 1 to 11 will be mainly described in the interest of brevity.

Figure 29:
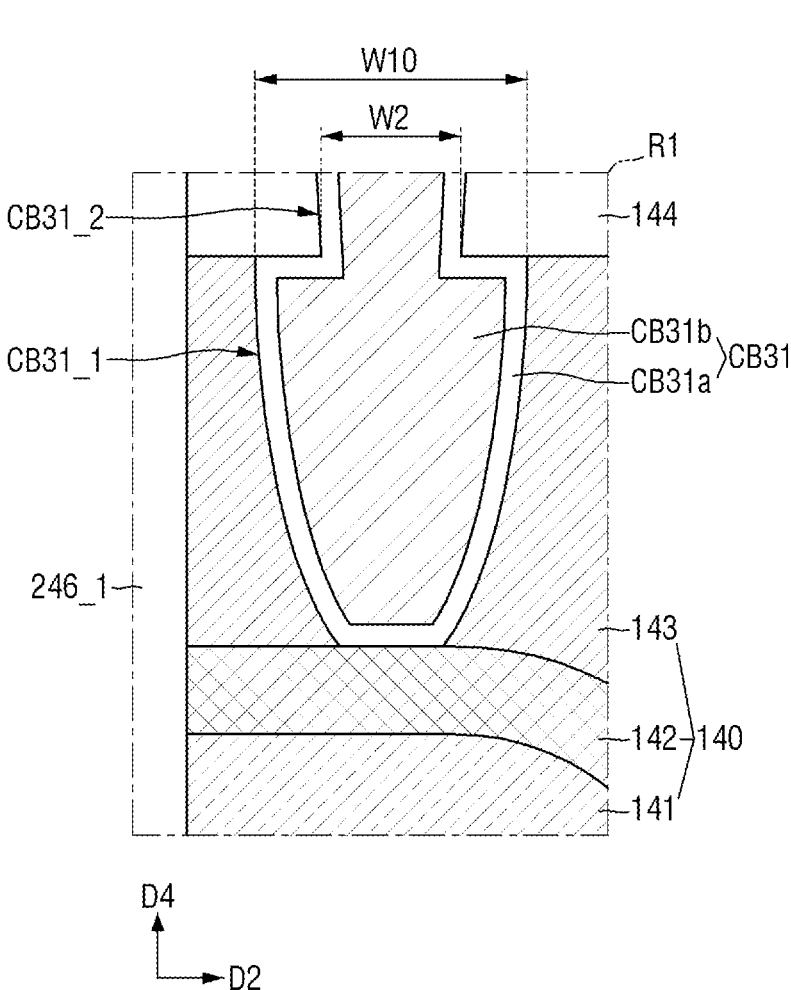
FIGS. 29 to 31 are enlarged views for describing a semiconductor memory device according to some exemplary embodiments of the present disclosure.
Figure 30:
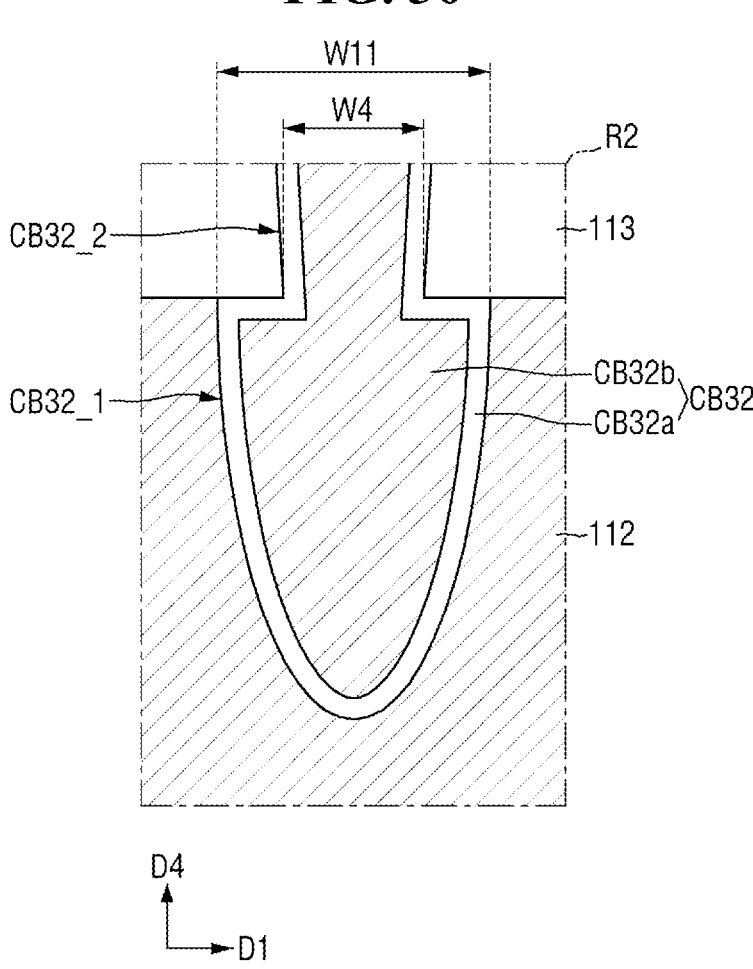
Figure 31:
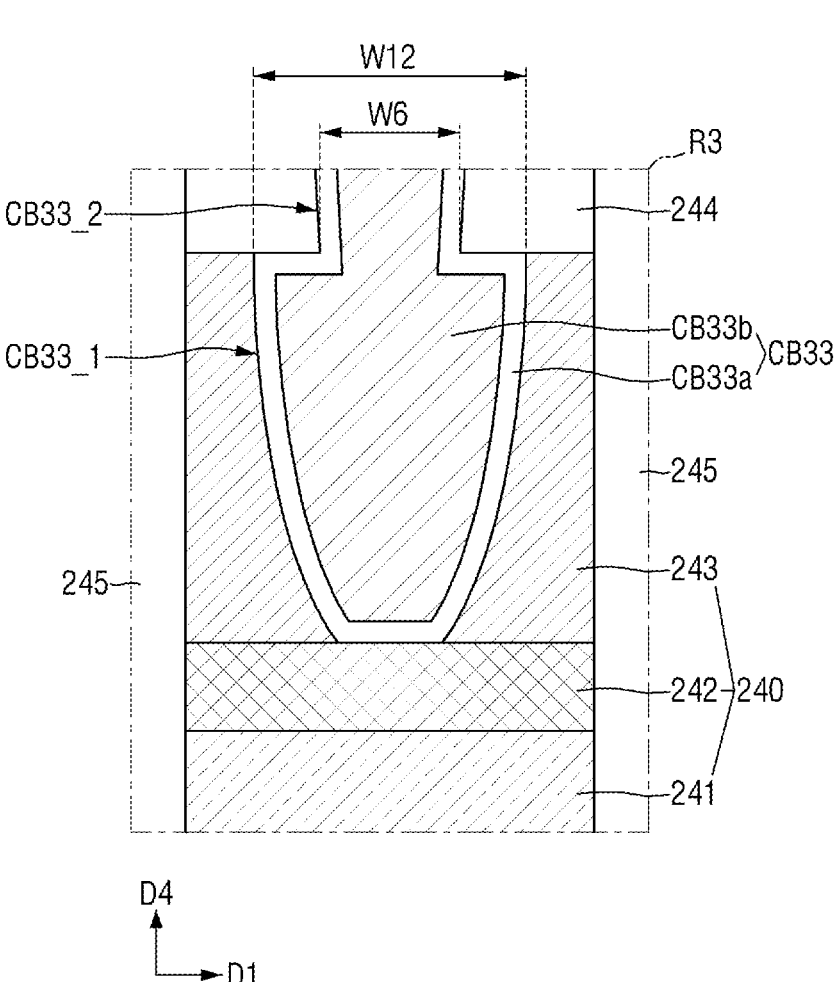

FIGS. 29 to 31 are enlarged views for describing a semiconductor memory device according to some still other exemplary embodiments of the present disclosure. FIG. 29 is an enlarged view of region R1 of FIG. 6; FIG. 30 is an enlarged view of region R2 of FIG. 8; and FIG. 31 is an enlarged view of region R3 of FIG. 10.

Referring to FIGS. 29 to 31, in a semiconductor memory device according to some still other exemplary embodiments of the present disclosure, a width of a first portion CB31_1 of a first contact CB31 in the second horizontal direction D2 may increase in a direction from an upper surface of the second cell conductive layer 142 toward a lower surface of the cell line capping layer 144. A width of a first portion CB32_1 of a second contact CB32 in the first horizontal direction D1 may increase in a direction from a bottom surface of the first portion CB32_1 of the second contact CB32 toward a lower surface of the cell gate capping layer 113. A width of a first portion CB33_1 of a third contact CB33 in the first horizontal direction D1 may increase in a direction from an upper surface of the second peripheral conductive layer 242 toward a lower surface of the peripheral capping layer 244.

In addition, at least a portion of an upper surface of the first portion CB31_1 of the first contact CB31 may be in contact with the cell line capping layer 144. At least a portion of an upper surface of the first portion CB32_1 of the second contact CB32 may be in contact with the cell gate capping layer 113. At least a portion of an upper surface of the first portion CB33_1 of the third contact CB33 may be in contact with the peripheral capping layer 244.

For example, a width W10 of the first portion CB31_1 of the first contact CB31 in the second horizontal direction D2 may be greater than a width W2 of a second portion CB31_2 of the first contact CB31 in the second horizontal direction D2. The first contact CB31 may include a first barrier layer CB31*a* and a first filling layer CB31*b* on the first barrier layer CB31*a*. In some embodiments, the width W10 of the first portion CB31_1 of the first contact CB31 in the second horizontal direction D2 may be a maximum width of the first portion CB31_1 of the first contact CB31 in the second horizontal direction D2.

For example, a width W11 of the first portion CB32_1 of the second contact CB32 in the first horizontal direction D1 may be greater than a width W4 of a second portion CB32_2 of the second contact CB32 in the first horizontal direction D1. The second contact CB32 may include a second barrier layer CB32a and a second filling layer CB32b on the second barrier layer CB32a. In some embodiments, the width W11 of the first portion CB32_1 of the second contact CB32 in the first horizontal direction D1 may be a maximum width of the first portion CB32_1 of the second contact CB32 in the first horizontal direction D1.

For example, a width W12 of the first portion CB33_1 of the third contact CB33 in the first horizontal direction D1 may be greater than a width W6 of a second portion CB33_2 of the third contact CB33 in the first horizontal direction D1. The third contact CB33 may include a third barrier layer CB33a and a third filling layer CB33b on the third barrier layer CB33a. In some embodiments, the width W12 of the first portion CB33_1 of the third contact CB33 in the first horizontal direction D1 may be a maximum width of the first portion CB33_1 of the third contact CB33 in the first horizontal direction D1.

Hereinafter, a semiconductor memory device according to some still other exemplary embodiments of the present disclosure will be described with reference to FIGS. 32 to 34.

Figure 32:
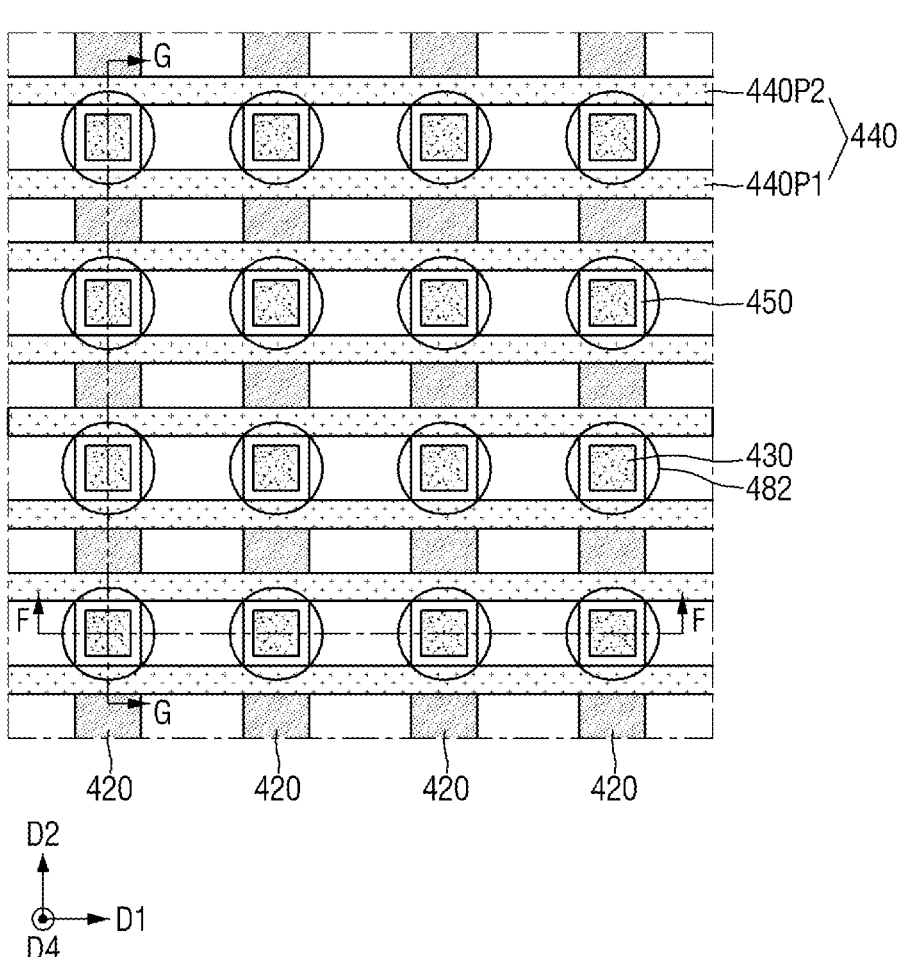
FIG. 32 is a layout view for describing a semiconductor memory device according to some exemplary embodiments of the present disclosure.

FIG. 32 is a layout view for describing a semiconductor memory device according to some still other exemplary embodiments of the present disclosure. FIG. 33 is a perspective view for describing a semiconductor memory device according to some still other exemplary embodiments of the present disclosure. FIG. 34 is a cross-sectional view taken along lines F-F and G-G of FIG. 32.

Figure 33:
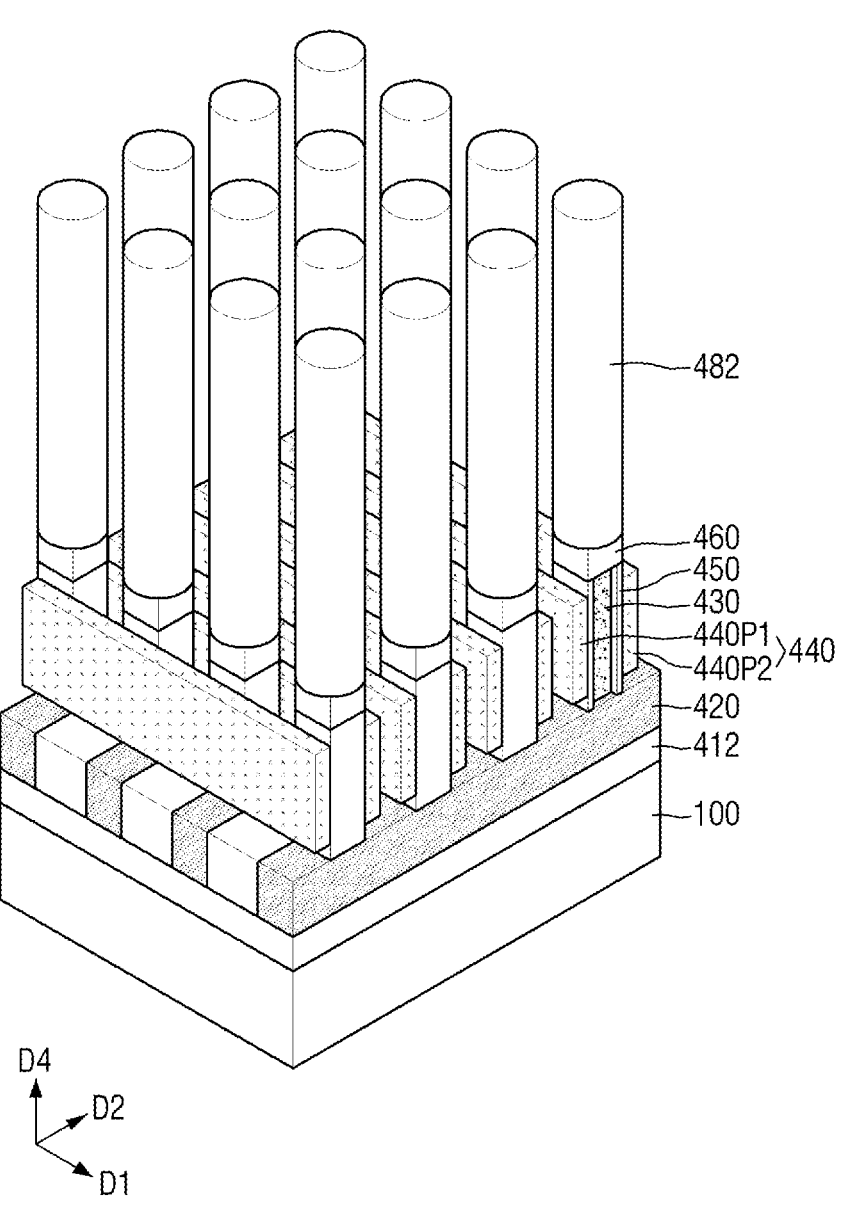
FIG. 33 is a perspective view for describing a semiconductor memory device according to some exemplary embodiments of the present disclosure.
Figure 34:
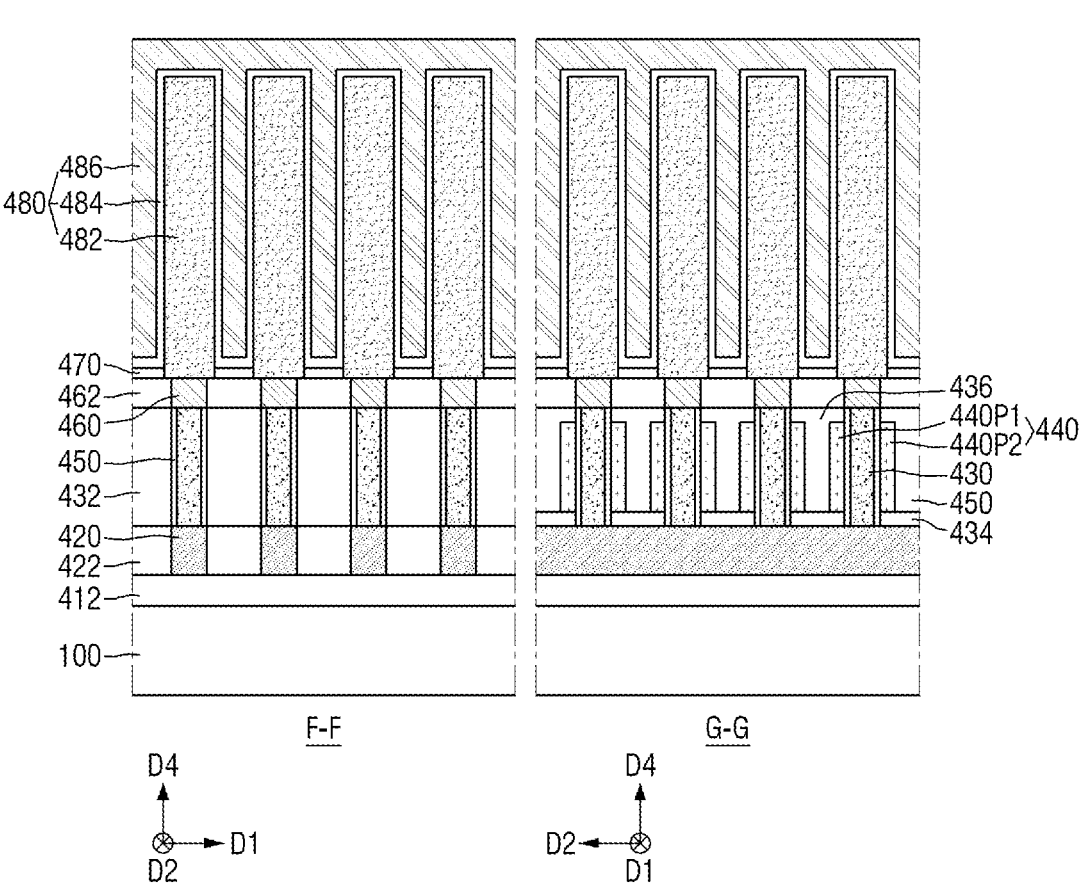
FIG. 34 is a cross-sectional view taken along lines F-F and G-G of FIG. 32.

Referring to FIGS. 32 to 34, a semiconductor memory device according to some exemplary embodiments of the present disclosure may include a substrate 100, a plurality of first conductive lines 420, a channel layer 430, a gate electrode 440, a gate insulating layer 450, and a capacitor 480. The semiconductor memory device according to some exemplary embodiments may be a memory device including a vertical channel transistor (VCT). The vertical channel transistor may refer to a structure in which a channel length of the channel layer 430 extends in a vertical direction from the substrate 100.

A lower insulating layer 412 may be on the substrate 100. The plurality of first conductive lines 420 may be spaced apart from each other in the first horizontal direction D1 and extend in the second horizontal direction D2 on the lower insulating layer 412. A plurality of first insulating patterns 422 may be on the lower insulating layer 412 to fill a space between the plurality of first conductive lines 420. The plurality of first insulating patterns 422 may extend in the second horizontal direction D2. Upper surfaces of the plurality of first insulating patterns 422 may be at the same level as upper surfaces of the plurality of first conductive lines 420. The plurality of first conductive lines 420 may function as bit lines.

The plurality of first conductive lines 420 may include a doped semiconductor material, a metal, conductive metal nitride, conductive metal silicide, conductive metal oxide, and/or combinations thereof. For example, the plurality of first conductive lines 420 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO, RuO, and/or combinations thereof, but are not limited thereto. The plurality of first conductive lines 420 may include a single layer or multiple layers of the materials described above. In exemplary embodiments, the plurality of first conductive lines 420 may include graphene, carbon nanotube, or a combination thereof.

The channel layer 430 may be arranged in a matrix form to be spaced apart from each other in the first horizontal direction D1 and the second horizontal direction D2 on the plurality of first conductive lines 420. The channel layer 430 may have a first width in the first horizontal direction D1 and a first height in the vertical direction D4, and the first height may be greater than the first width. Here, the vertical direction D4 may be a direction that intersects the first horizontal direction D1 and the second horizontal direction D2, and for example, perpendicular to the upper surface of the substrate 100. For example, the first height may be about 2 to 10 times the first width, but is not limited thereto. A bottom portion of the channel layer 430 may function as a third source/drain region (not illustrated), an upper portion of the channel layer 430 may function as a fourth source/drain region (not illustrated), and a portion of the channel layer 430 between the third and fourth source/drain regions may function as a channel region (not illustrated).

In exemplary embodiments, the channel layer 430 may include an oxide semiconductor, and for example, the oxide semiconductor may include InxGayZnzO, InxGaySizO, InxSnyZnzO, InxZnyO, ZnxO, ZnxSnyO, ZnxOyN, ZrxZnySnzO, SnxO, HfxInyZnzO, GaxZnySnzO, AlxZnySnzO, YbxGayZnzO, InxGayO, and/or combinations thereof. The channel layer 430 may include a single layer or multiple layers of the oxide semiconductor. In some examples, the channel layer 430 may have a bandgap energy greater than that of silicon. For example, the channel layer 430 may have a bandgap energy of about 1.5 eV to about 5.6 eV. For example, the channel layer 430 may have optimal channel performance when it has a bandgap energy of about 2.0 eV to 4.0 eV. For example, the channel layer 430 may be polycrystalline or amorphous, but is not limited thereto. In exemplary embodiments, the channel layer 430 may include graphene, carbon nanotube, or a combination thereof.

The gate electrode 440 may extend in the first horizontal direction D1 on both sidewalls of the channel layer 430. The gate electrode 440 may include a first sub-gate electrode 440P1 facing a first sidewall of the channel layer 430, and a second sub-gate electrode 440P2 facing a second sidewall opposite to the first sidewall of the channel layer 430. As one channel layer 430 is between the first sub-gate electrode 440P1 and the second sub-gate electrode 440P2, the semiconductor memory device may have a dual gate transistor structure. However, the present disclosure is not limited thereto, and as the second sub-gate electrode 440P2 is omitted and only the first sub-gate electrode 440P1 that faces the first sidewall of the channel layer 430 is formed, a single gate transistor structure may also be implemented. A description of the material included in the gate electrode 440 may be the same as that of the cell gate electrode 112.

The gate insulating layer 450 may surround the sidewall of the channel layer 430 and may be interposed between the channel layer 430 and the gate electrode 440. For example, as illustrated in FIG. 34, an entirety of the sidewall of the channel layer 430 may be surrounded by the gate insulating layer 450, and a portion of the sidewall of the gate electrode 440 may be in contact with the gate insulating layer 450. In other exemplary embodiments, the gate insulating layer 450 may extend in an extending direction of the gate electrode 440 (i.e., the first horizontal direction D1), and only two sidewalls facing the gate electrode 440 among the sidewalls of the channel layer 430 may also be in contact with the gate insulating layer 450. In exemplary embodiments, the gate insulating layer 450 may be formed of a silicon oxide layer, a silicon oxynitride layer, a high-k material having a higher dielectric constant than that of the silicon oxide layer, or a combination thereof.

A plurality of second insulating patterns 432 may extend along the second horizontal direction D2 on the plurality of first insulating patterns 422. The channel layer 430 may be between two adjacent second insulating patterns 432 among the plurality of second insulating patterns 432. In addition, a first buried layer 434 and a second buried layer 436 may be in a space between two adjacent channel layers 430 between the two adjacent second insulating patterns 432. The first buried layer 434 may be on a bottom portion of the space between the two adjacent channel layers 430. The second buried layer 436 may be formed to fill the remainder of the space between the two adjacent channel layers 430 on the first buried layer 434. An upper surface of the second buried layer 436 may be at the same level as an upper surface of the channel layer 430, and the second buried layer 436 may cover an upper surface of the gate electrode 440. In some embodiments, and in contrast to that which is illustrated in the figures, the plurality of second insulating patterns 432 may be formed of a material layer that is continuous with the plurality of first insulating patterns 422, or the second buried layer 436 may be formed of a material layer that is continuous with the first buried layer 434.

A capacitor contact 460 may be on the channel layer 430. The capacitor contacts 460 may be arranged to vertically overlap the channel layer 430 and may be arranged in a matrix form spaced apart from each other in the first horizontal direction D1 and the second horizontal direction D2. The capacitor contact 460 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, and/or a combination thereof, but is not limited thereto. An upper insulating layer 462 may surround a sidewall of the capacitor contact 460 on the plurality of second insulating patterns 432 and the second buried layer 436.

A third etching stop layer 470 may be on the upper insulating layer 462. A capacitor 480 may be on the third etching stop layer 470. The capacitor 480 may include a second lower electrode 482, a second capacitor dielectric layer 484, and a second upper electrode 486. The second lower electrode 482 may extend through the third etching stop layer 470 and may be electrically connected to an upper surface of the capacitor contact 460. The second lower electrode 482 may be formed in a pillar type extending in the vertical direction D4, but is not limited thereto. In exemplary embodiments, the second lower electrodes 482 may be arranged to vertically overlap the capacitor contact 460 and may be arranged in a matrix form to be spaced apart from each other in the first horizontal direction D1 and the second horizontal direction D2. In some embodiments, a landing pad (not illustrated) may be arranged between the capacitor contact 460 and the second lower electrode 482, so that the second lower electrodes 482 may also be arranged in a hexagonal shape.

Hereinafter, a semiconductor memory device according to some exemplary embodiments of the present disclosure will be described with reference to FIGS. 35 and 36.

Figure 35:
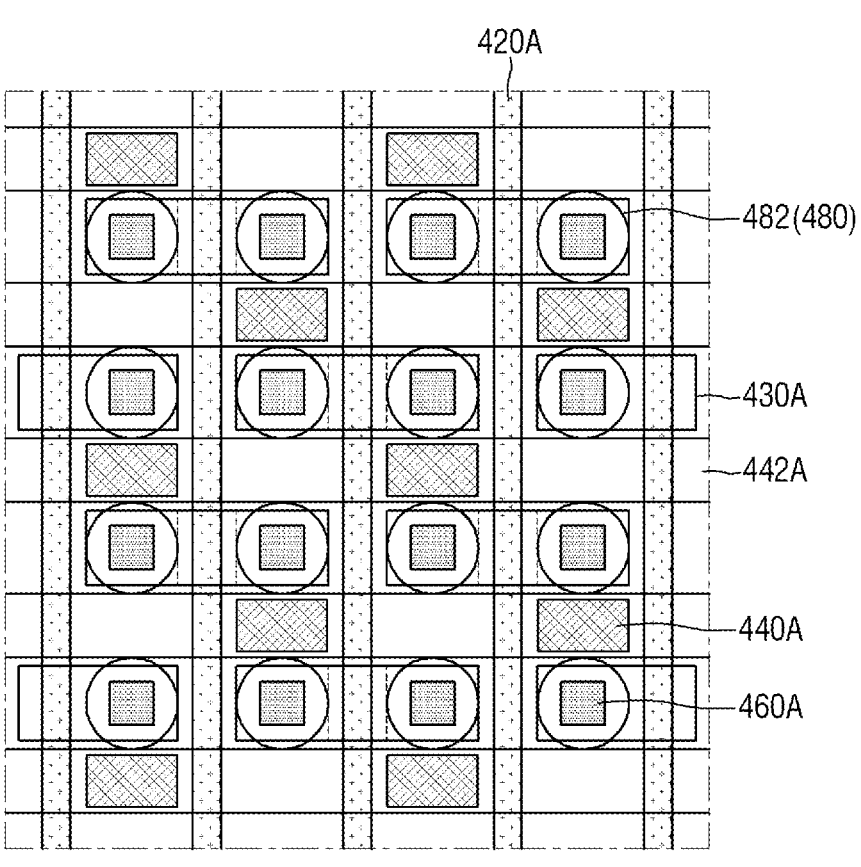
FIG. 35 is a layout view for describing a semiconductor memory device according to some exemplary embodiments of the present disclosure.
Figure 35:
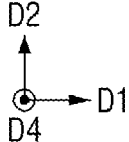

FIG. 35 is a layout view for describing a semiconductor memory device according to some exemplary embodiments of the present disclosure. FIG. 36 is a perspective view for describing a semiconductor memory device according to some exemplary embodiments of the present disclosure.

Figure 36:
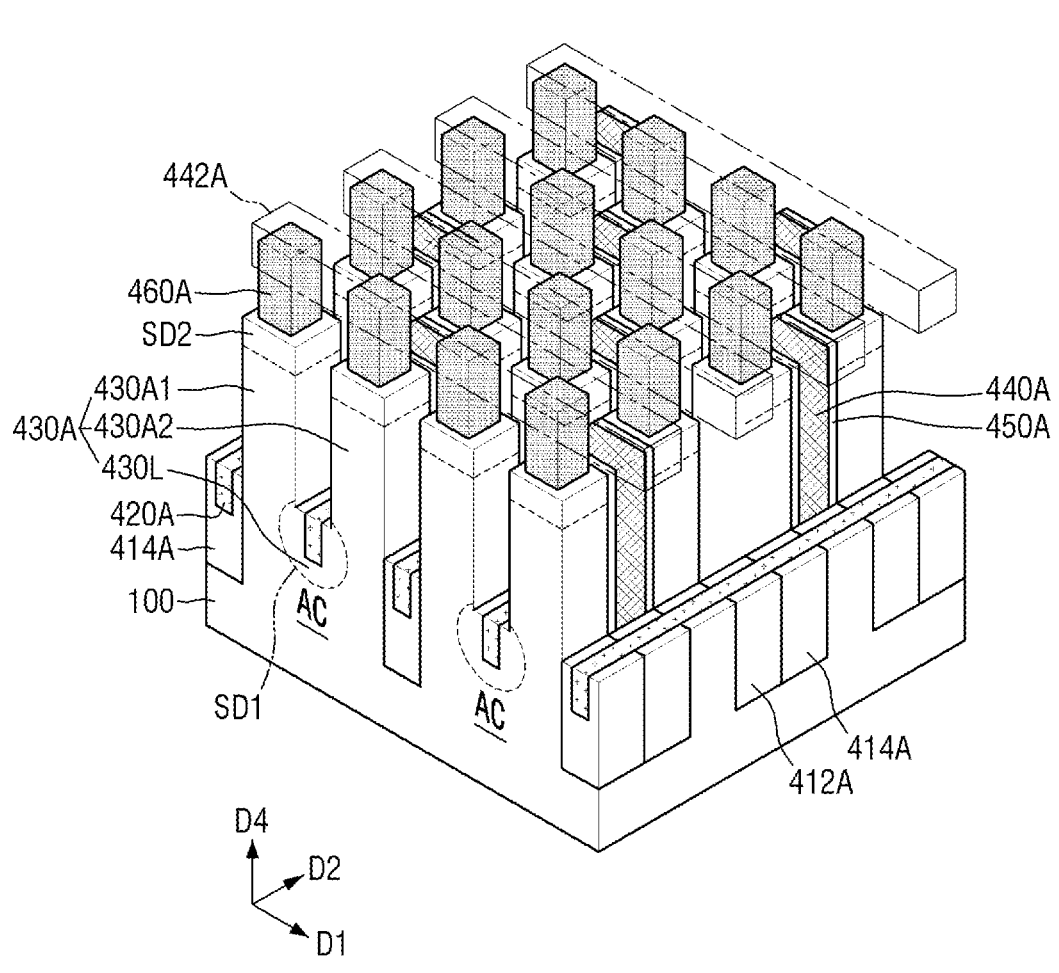
FIG. 36 is a perspective view for describing a semiconductor memory device according to some exemplary embodiments of the present disclosure.

Referring to FIGS. 35 to 36, a semiconductor memory device according to some exemplary embodiments of the present disclosure may include the substrate 100, a plurality of first conductive lines 420A, a channel structure 430A, a contact gate electrode 440A, a plurality of second conductive lines 442A, and the capacitor 480. The semiconductor memory device according to some exemplary embodiments may be a memory device including a vertical channel transistor (VCT).

A plurality of second active regions AC may be defined in the substrate 100 by a first element separation pattern 412A and a second element separation pattern 414A. The channel structure 430A may be provided in each of the second active regions AC. The channel structure 430A may include a first active pillar 430A1 and a second active pillar 430A2 extending in the vertical direction, respectively, and a connection portion 430L connected to a bottom portion of the first active pillar 430A1 and a bottom portion of the second active pillar 430A2. A first source/drain region SD1 may be in the connection portion 430L. A second source/drain region SD2 may be on an upper side of the first and second active pillars 430A1 and 430A2. The first active pillar 430A1 and the second active pillar 430A2 may each constitute an independent unit memory cell.

The plurality of first conductive lines 420A may extend in a direction intersecting each of the plurality of second active regions AC, for example, in the second horizontal direction D2. One first conductive line 420A of the plurality of first conductive lines 420A may be on the connection portion 430L between the first active pillar 430A1 and the second active pillar 430A2. One first conductive line 420A may be on the first source/drain region SD1. Another first conductive line 420A adjacent to one first conductive line 420A may be between the two channel structures 430A. One first conductive line 420A of the plurality of first conductive lines 420A may function as a common bit line included in the two unit memory cells constituted by the first active pillar 430A1 and the second active pillar 430A2 on both sides of the one first conductive line 420A.

One contact gate electrode 440A may be between two channel structures 430A adjacent in the second horizontal direction D2. For example, the contact gate electrode 440A may be between the first active pillar 430A1 included in one channel structure 430A and the second active pillar 430A2 of the channel structure 430A adjacent thereto. One contact gate electrode 440A may be shared by the first active pillar 430A1 and the second active pillar 430A2 on both sidewalls thereof. A gate insulating layer 450A may be between the contact gate electrode 440A and the first active pillar 430A1 and between the contact gate electrode 440A and the second active pillar 430A2. The plurality of second conductive lines 442A may extend in the first horizontal direction D1 on an upper surface of the contact gate electrode 440A. The plurality of second conductive lines 442A may function as word lines of the semiconductor memory device.

A capacitor contact 460A may be on the channel structure 430A. The capacitor contact 460A may be on the second source/drain region SD2, and the capacitor 480 may be on the capacitor contact 460A.

Some exemplary embodiments of the present disclosure have been described hereinabove with reference to the accompanying drawings, but the present disclosure is not limited to the above-described exemplary embodiments, and may be implemented in various different forms. Those of ordinary skill in the art to which the present disclosure pertains may understand that the present disclosure may be implemented in other specific forms without significant departure from the inventive concepts of the present disclosure. Therefore, it should be understood that the exemplary embodiments described above are illustrative in all aspects and not restrictive.

What is claimed is:

1. A semiconductor memory device comprising:
a substrate including a cell region and a peripheral region defined around the cell region;
a gate structure on the substrate, and including a first conductive layer including polysilicon, a second conductive layer on the first conductive layer, a third conductive layer on the second conductive layer, and a capping layer on the third conductive layer, wherein the first to third conductive layers include different materials;
a spacer on a sidewall of each of the first to third conductive layers and the capping layer; and
a first contact that extends through the capping layer and into the third conductive layer, the first contact in contact with the second conductive layer and separated from the first conductive layer, the first contact including a first portion inside the third conductive layer and a second portion inside the capping layer,
wherein a width of the first portion of the first contact in a first horizontal direction is greater than a width of the second portion of the first contact in the first horizontal direction.

2. The semiconductor memory device of claim 1, wherein the gate structure is on the cell region of the substrate.

3. The semiconductor memory device of claim 2, further comprising a bit line contact that is in contact with the second conductive layer of the gate structure and that extends through the first conductive layer and extend into the substrate.

4. The semiconductor memory device of claim 1, wherein the gate structure is on the peripheral region of the substrate.

5. The semiconductor memory device of claim 1, further comprising:
a cell gate electrode inside the cell region of the substrate;
a cell gate capping layer on the cell gate electrode; and
a second contact extending through the cell gate capping layer and into the cell gate electrode, the second contact including a first portion in the cell gate electrode and a second portion in the cell gate capping layer,
wherein a width of the first portion of the second contact in a second horizontal direction is greater than a width of the second portion of the second contact in the second horizontal direction.

6. The semiconductor memory device of claim 1, wherein the first contact is in contact with an uppermost surface of the second conductive layer.

7. The semiconductor memory device of claim 1, wherein a sidewall of the first portion of the first contact protrudes convexly in the first horizontal direction.

8. The semiconductor memory device of claim 1, wherein at least a portion of an upper surface of the first portion of the first contact is in contact with the capping layer.

9. The semiconductor memory device of claim 8, wherein the width of the first portion of the first contact in the first horizontal direction increases from an upper surface of the second conductive layer toward a lower surface of the capping layer.

10. The semiconductor memory device of claim 1, wherein the spacer is in contact with the sidewall of each of the first to third conductive layers and the capping layer.

11. The semiconductor memory device of claim 1, wherein the second conductive layer includes titanium silicon nitride (TiSiN), and wherein the third conductive layer includes tungsten (W).

12. A semiconductor memory device comprising:
a substrate including a cell region and a peripheral region defined around the cell region;
a gate structure on the cell region of the substrate and extending in a first horizontal direction, the gate structure including first, second, and third conductive layers that are sequentially stacked and a capping layer on the third conductive layer, the first conductive layer including polysilicon;
a bit line contact in contact with the second conductive layer of the gate structure, and extending through the first conductive layer and extend into the substrate; and
a first contact extending through the capping layer and into the third conductive layer, the first contact in contact with the second conductive layer, the first contact separated from the first conductive layer, the first contact including a first portion in the third conductive layer and a second portion in the capping layer,
wherein a width of the first portion of the first contact in the first horizontal direction is greater than a width of the second portion of the first contact in the first horizontal direction.

13. The semiconductor memory device of claim 12, further comprising:
a cell gate electrode inside the cell region of the substrate, the cell gate electrode extending in a second horizontal direction different from the first horizontal direction;
a cell gate capping layer on the cell gate electrode; and
a second contact that extends through the cell gate capping layer and extend into the cell gate electrode, the second contact including a first portion inside the cell gate electrode and a second portion inside the cell gate capping layer,
wherein a width of the first portion of the second contact in the second horizontal direction is greater than a width of the second portion of the second contact in the second horizontal direction.

14. The semiconductor memory device of claim 12, wherein the first, second, and third conductive layers include different materials.

15. The semiconductor memory device of claim 12, further comprising a spacer in contact with a sidewall of each of the first to third conductive layers and the capping layer.

16. The semiconductor memory device of claim 12, wherein the first contact is in contact with an uppermost surface of the second conductive layer.

17. A semiconductor memory device comprising:
a substrate including a cell region and a peripheral region defined around the cell region;
a gate structure on the peripheral region of the substrate, and including a gate insulating layer, a first conductive layer including polysilicon, a second conductive layer on the first conductive layer, a third conductive layer on the second conductive layer, a capping layer on the third conductive layer, and a spacer in contact with a sidewall of each of the gate insulating layer, the first to third conductive layers and the capping layer; and
a contact extending through the capping layer and into the third conductive layer, the contact in contact with the second conductive layer and separated from the first conductive layer, the contact including a first portion in the third conductive layer and a second portion in the capping layer, wherein a width of the first portion of the contact in a horizontal direction is greater than a width of the second portion of the contact in the horizontal direction.

18. The semiconductor memory device of claim 17, wherein the contact is in contact with an uppermost surface of the second conductive layer.

19. The semiconductor memory device of claim 17, wherein a sidewall of the first portion of the contact protrudes convexly in the horizontal direction.

20. The semiconductor memory device of claim 17, wherein the second conductive layer includes titanium silicon nitride (TiSiN), and wherein the third conductive layer includes tungsten (W).

* * * * *